United States Patent
Lee et al.

(10) Patent No.: US 10,727,433 B2
(45) Date of Patent: Jul. 28, 2020

(54) DISPLAY DEVICE

(71) Applicant: SAMSUNG DISPLAY CO., LTD., Yongin-si, Gyeonggi-do (KR)

(72) Inventors: Duckjung Lee, Yongin-si (KR); Jiyoung Choung, Yongin-si (KR); Arong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/378,905

(22) Filed: Apr. 9, 2019

(65) Prior Publication Data

US 2019/0334112 A1  Oct. 31, 2019

(30) Foreign Application Priority Data

Apr. 30, 2018 (KR) .................. 10-2018-0050161

(51) Int. Cl.
*H01L 51/52* (2006.01)
*H01L 27/32* (2006.01)

(52) U.S. Cl.
CPC ...... *H01L 51/5228* (2013.01); *H01L 27/3246* (2013.01); *H01L 27/3276* (2013.01); *H01L 51/5253* (2013.01); *H01L 27/3211* (2013.01); *H01L 2227/323* (2013.01)

(58) Field of Classification Search
CPC ............. H01L 51/5228; H01L 27/3246; H01L 51/5253; H01L 27/3276; H01L 27/3211; H01L 51/0011; H01L 2227/323

USPC ........ 257/40, 72, 81, 89; 438/22, 48, 82, 95, 438/128
See application file for complete search history.

(56) References Cited

U.S. PATENT DOCUMENTS

| | | | |
|---|---|---|---|
| 9,231,211 B2 | 1/2016 | Lee et al. | |
| 9,893,139 B2 | 2/2018 | Kim et al. | |
| 9,941,488 B2 | 4/2018 | Lee et al. | |
| 2008/0048562 A1* | 2/2008 | Matsuda | ............. H01L 51/5228 313/506 |

FOREIGN PATENT DOCUMENTS

| | | |
|---|---|---|
| JP | 4608921 B2 | 10/2010 |
| KR | 10-2002-0029553 A | 4/2002 |

(Continued)

*Primary Examiner* — Thinh T Nguyen
(74) *Attorney, Agent, or Firm* — Lewis Roca Rothgerber Christie LLP

(57) ABSTRACT

A display device includes a substrate including a display area and a peripheral area; pixel electrodes in the display area and spaced apart from each other; a pixel-defining layer exposing upper surfaces of the pixel electrodes, covering edges of the pixel electrodes, and including an inorganic insulating material; an auxiliary electrode on the pixel-defining layer; a first intermediate layer on a first pixel electrode among the pixel electrodes; a first opposite electrode on the first intermediate layer; a second intermediate layer on a second pixel electrode from among the pixel electrodes, the second pixel electrode neighboring the first pixel electrode; a second opposite electrode on the second intermediate layer and electrically connected to the first opposite electrode via the auxiliary electrode; a power voltage supply line in the peripheral area; and a connection electrode layer electrically connecting the auxiliary electrode to the power voltage supply line.

25 Claims, 22 Drawing Sheets

(56) References Cited

FOREIGN PATENT DOCUMENTS

| KR | 10-0337493 B1 | 5/2002 |
|---|---|---|
| KR | 10-2017-0043697 A | 4/2017 |
| KR | 10-2017-0114027 A | 10/2017 |

\* cited by examiner

DISPLAY DEVICE

CROSS-REFERENCE TO RELATED APPLICATION

Korean Patent Application No. 10-2018-0050161, filed on Apr. 30, 2018, in the Korean Intellectual Property Office, and entitled: "Display Device," is incorporated by reference herein in its entirety.

BACKGROUND

1. Field

One or more embodiments relate to a display device.

2. Description of the Related Art

An organic light-emitting display device is a display device in which each pixel includes an organic light-emitting diode. The organic light-emitting diode includes a pixel electrode, a light-emitting layer, and an opposite electrode.

In the case of an organic light-emitting display device in which full color is implemented, light of different colors is emitted in each pixel area. An opposite electrode integrally formed with a light-emitting layer in each of a plurality of pixels may be formed by using a deposition mask. As an organic light-emitting display device gradually becomes higher in resolution, a width of an open slit of a mask used in a deposition process becomes narrower, and a distribution of the width of the open slit is required to be gradually reduced. In addition, it is required that a shadow effect be reduced or eliminated in order to manufacture a high-resolution organic light-emitting device. Accordingly, a method of performing a deposition process with a substrate adhered to a mask may be used.

SUMMARY

According to one or more embodiments, a display device includes a substrate including a display area and a peripheral area outside the display area; pixel electrodes in the display area and spaced apart from each other; a pixel-defining layer exposing a portion of each of upper surfaces of the pixel electrodes, covering edges of the pixel electrodes, and including an inorganic insulating material; an auxiliary electrode on the pixel-defining layer; a first intermediate layer on a first pixel electrode among the pixel electrodes; a first opposite electrode on the first intermediate layer; a second intermediate layer on a second pixel electrode from among the pixel electrodes, the second pixel electrode neighboring the first pixel electrode; a second opposite electrode on the second intermediate layer and electrically connected to the first opposite electrode via the auxiliary electrode; a power voltage supply line in the peripheral area; and a connection electrode layer electrically connecting the auxiliary electrode to the power voltage supply line.

The power voltage supply line may be spaced apart from the auxiliary electrode and surround a portion of the auxiliary electrode in a plan view.

The connection electrode layer may be located on the auxiliary electrode and the power voltage supply line.

The auxiliary electrode may be in direct contact with an upper surface of the pixel-defining layer.

The display device may further include a conductive protective layer covering at least one of the first opposite electrode or the second opposite electrode.

A width of the conductive protective layer may be greater than a width of the at least one of the first opposite electrode or the second opposite electrode, and the conductive protective layer may be in direct contact with the opposite electrode and the auxiliary electrode.

A material of the connection electrode layer may be the same as a material of the conductive protective layer.

The conductive protective layer may include a transparent conductive oxide.

The display device may further include an insulating protective layer covering at least one of the first opposite electrode or the second opposite electrode.

The insulating protective layer may include an inorganic insulating material.

The display device may further include an insulating layer covering the connection electrode layer, wherein the insulating layer includes a material which is the same as a material of the insulating protective layer.

According to one or more embodiments, a display device includes pixel electrodes arranged in the display area and spaced apart from each other; a pixel-defining layer exposing a portion of each of upper surfaces of the pixel electrodes, covering edges of the pixel electrodes, and including an inorganic insulating material; an auxiliary electrode on the pixel-defining layer; a first intermediate layer and a first opposite electrode, both located on a first pixel electrode among the pixel electrodes; a first conductive protective layer on the first opposite electrode; a second intermediate layer and a second opposite electrode. both located on a second pixel electrode among the pixel electrodes; and a second conductive protective layer on the second opposite electrode.

The auxiliary electrode may be covering the display area and include holes corresponding to the pixel electrodes.

The auxiliary electrode may be located only on the pixel-defining layer.

An end of each of the first conductive protective layer and the second conductive protective layer may be in contact with the auxiliary electrode.

At least one of the first conductive protective layer or the second conductive protective layer may include a transparent conductive oxide.

The display device may further include a first insulating protective layer and a second insulating protective layer which respectively correspond to the first conductive protective layer and the second conductive protective layer.

The first insulating protective layer and the second insulating protective layer may include an inorganic insulating material.

An end of each of the first insulating protective layer and the second insulating protective layer may be in contact with the auxiliary electrode.

The pixel-defining layer may further include a mound in a position corresponding to an end of each of the pixel electrodes.

The display device may further include an insulating layer below the pixel-defining layer, wherein a height from the insulating layer to an area, which does not overlap each of the pixel electrodes, of the pixel-defining layer is smaller than a height from the insulating layer to the mound.

The display device may further include a power voltage supply line electrically connected to the auxiliary electrode.

The power voltage supply line may be spaced apart from the auxiliary electrode.

The display device may further include a connection electrode layer electrically connecting the auxiliary electrode to the power voltage supply line.

The connection electrode layer may cover the power voltage supply line and an edge of the auxiliary electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
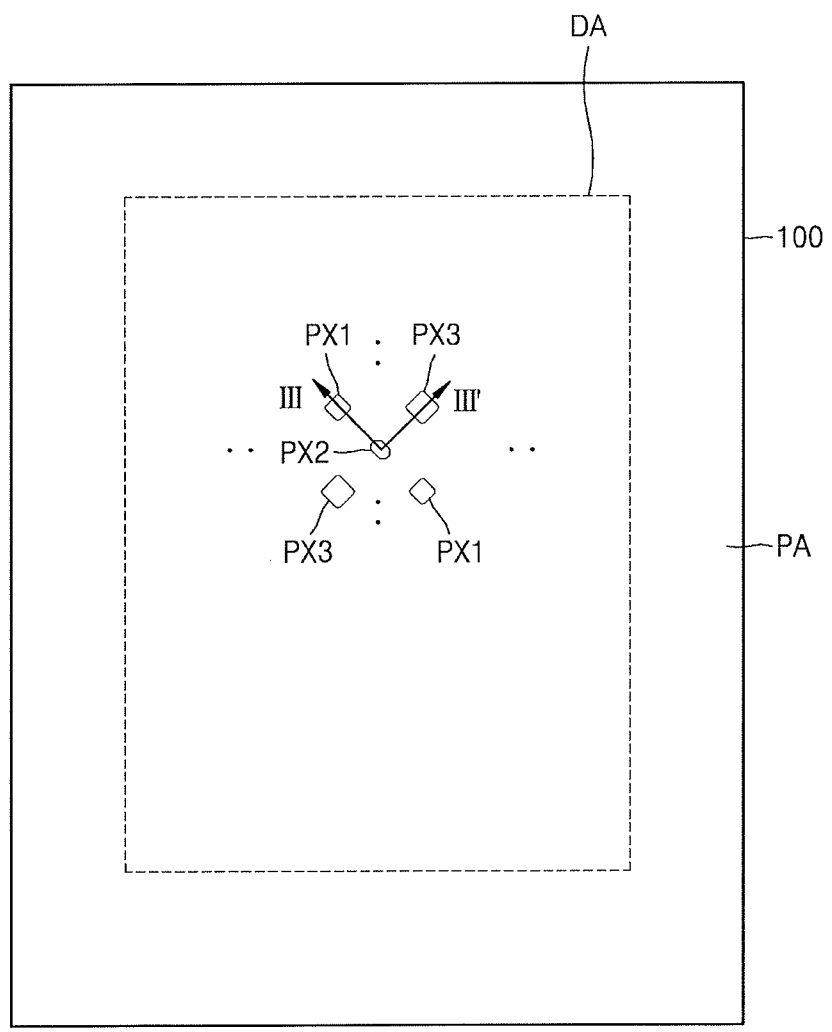
FIG. 1 illustrates a schematic plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

Hereinafter, embodiments will be described in detail with reference to the accompanying drawings. Like reference numerals in the drawings denote like elements, and thus their description will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region. or component is referred to as being "connected to" or "coupled to" another layer, region, or component, it may be "directly connected or coupled" to the other layer, region, or component, or "indirectly connected to" the other layer, region, or component with intervening elements therebetween. For example, when a layer, region, or component is referred to as being electrically "connected to" or "coupled to" another layer, region, or component, it may be "directly connected or coupled" to the other layer, region, or component, or "indirectly connected to" the other layer, region, or component with intervening elements therebetween.

FIG. 1 is a schematic plan view of a display device according to an embodiment. As shown in FIG. 1, the display device includes a display area DA that may display an image and a peripheral area PA outside the display area DA. It may be understood that FIG. 1 shows a substrate 100 of the display device. For example, it may be understood that the substrate 100 includes the display area DA and the peripheral area PA.

In the display area DA, pixels emitting light with different colors are arranged. In relation to this, FIG. 1 shows first, second, and third pixels PX1, PX2, and PX3 emitting red, green, and blue light respectively. FIG. 1 illustrates a structure in which the first to third pixels PX1 to PX3 are arranged in a pentile type, but may be variously modified.

The peripheral area PA is a non-display area, and may include a driver, a power voltage supply line, etc., to provide electrical signals or power to the pixels. The peripheral area PA may include a pad that is an area in which an electrical device, a printed circuit board, etc., may be connected to each other.

Figure 2:
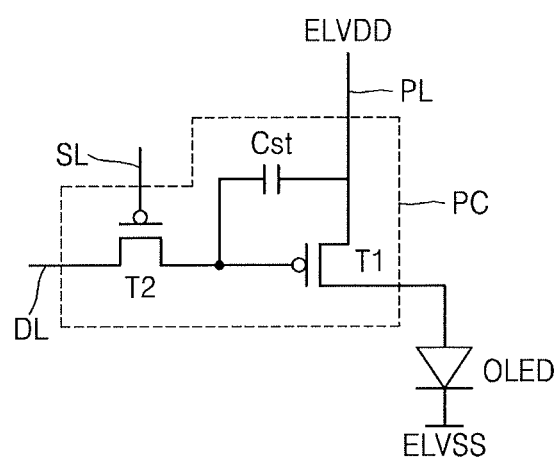
FIG. 2 illustrates an equivalent circuit diagram of a pixel of the display device according to an embodiment.

FIG. 2 is an equivalent circuit diagram of a pixel of the display device according to an embodiment. Referring to FIG. 2, the pixel includes a pixel circuit PC and a display element connected to the pixel circuit PC. FIG. 2 shows an organic light-emitting diode OLED as the display element. The pixel circuit PC may include a first thin-film transistor T1, a second thin-film transistor T2, and a storage capacitor Cst.

The second thin-film transistor T2 is a switching thin-film transistor connected to a scan line SL and a data line DL. According to a switching voltage input from the scan line SL, when a data voltage is input from the data line DL to the second thin-film transistor T2, the second thin-film transistor T2 transmits the data voltage to the first thin-film transistor T1. The storage capacitor Cst is connected to the second thin-transistor T2 and a driving voltage line PL, and stores a voltage corresponding to a difference between a voltage received from the second thin-film transistor T2 and a first power voltage ELVDD supplied to the driving voltage line PL.

The first thin-film transistor T1 is a driving thin-film transistor connected to the driving voltage line PL and the storage capacitor Cst. In correspondence with a voltage value stored in the storage capacitor Cst, the first thin-film transistor T1 may control driving current Id flowing from the driving voltage line PL through the organic light-emitting diode OLED. The organic light-emitting diode OLED may emit light with certain brightness according to the driving voltage Id. An opposite electrode (e.g., a cathode) of the organic light-emitting diode OLED may receive a second power voltage ELVSS.

FIG. 2 illustrates that the pixel circuit PC includes two thin-film transistors T1 and T2 and one storage capacitor Cst. Alternatively, a number of thin-film transistors and a number of storage capacitors may be variously modified according to a design of the pixel circuit PC.

Figure 3:
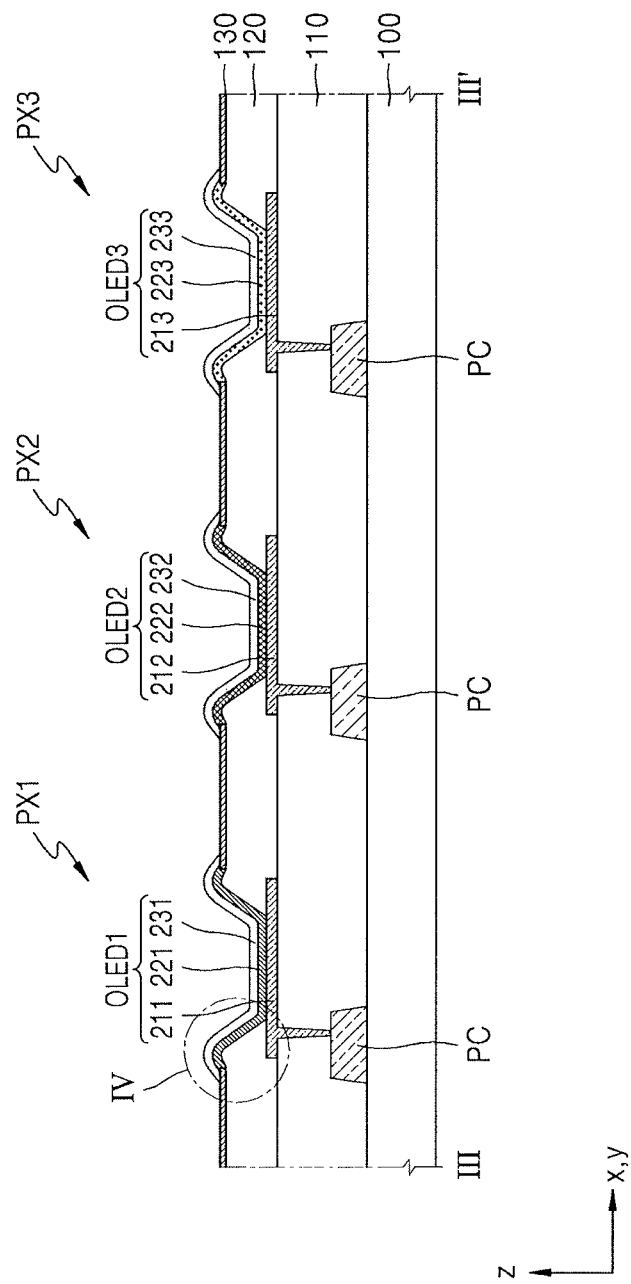
FIG. 3 illustrates a cross-sectional view of the display device taken along line III-III' of FIG. 1 according to an embodiment.

FIG. 3 is a cross-sectional view of the display device taken along a line of FIG. 1 according to an embodiment. Referring to FIG. 3, the first to third pixels PX1 to PX3 in the display area DA each includes the pixel circuit PC. The pixel circuit PC is arranged between the substrate 100 and an insulating layer 110, and includes the thin-film transistors, the storage capacitor, etc., described with reference to FIG. 2. The substrate 100 may include polymer resin, e.g., polyethersulfone (PES), polyarylate (PAR), polyetherimide (PEI), polyethylene naphthalate (PEN), polyethylene terephthalate (PET), pOlyphenylene sulfide (PPS), polyimide (PI), polycarbonate (PC), cellulose acetate propionate (CAP), etc.

The insulating layer 110 may cover the pixel circuit PC. The insulating layer 110 may be a planarization insulating layer providing a flat surface. The insulating layer 110 may include an organic insulating layer, e.g., P1, etc. Between the substrate 100 and the insulating layer 110, components of the pixel circuit PC, e.g., a semiconductor layer, a gate electrode, a source electrode, and a drain electrode of the thin-film transistor and electrode plates of the storage capacitor may be included. In addition, inorganic insulating layers and/or organic insulating layers that may be arranged between the semiconductor layer and the gate electrode of the thin-film transistor, the gate electrode and the source or drain electrode of the thin-film transistor, or the electrode plates constituting the storage capacitor may be further included between the substrate 100 and the insulating layer 110.

The first to third pixels PX1 to PX3 may each include a first organic light-emitting diode OLED1, a second organic light-emitting diode OLED2, and a third organic light-emitting diode OLED3, respectively, each connected to the pixel circuit PC. Each of the first to third organic light-emitting diode OLED1 to OLED3 may include a pixel electrode, an intermediate layer, and an opposite electrode. The first organic light-emitting diode OLED1 includes a first pixel electrode 211, a first intermediate layer 221, and a first opposite electrode 231. The second organic light-emitting diode OLED2 includes a second pixel electrode 212, a second intermediate layer 222, and a second opposite electrode 232. The third organic light-emitting diode OLED3 includes a third pixel electrode 213, a third intermediate layer 223, and a third opposite electrode 233.

The first intermediate layer 221 and the first opposite electrode 231 are patterned in correspondence with the first pixel electrode 211. The second intermediate layer 222 and the second opposite electrode 232 are patterned in correspondence with the second pixel electrode 212. The third intermediate layer 223 and the third opposite electrode 233 are patterned in correspondence with the third pixel electrode 213.

The first to third pixel electrodes 211 to 213 are arranged on the insulating layer 110 to be spaced apart from each other. The first to third pixel electrodes 211 to 213 may include a reflective layer formed of silver (Ag), magnesium (Mg), aluminum (Al), platinum (Pt), palladium (Pd), gold (Au), nickel (Ni), neodymium (Nd), iridium (Ir). chromium (Cr), a compound thereof, etc. Alternatively, the first to third pixel electrodes 211 to 213 may include the reflective layer described above and a transparent conductive oxide (TCO) layer above and/or below the reflective layer. The TCO layer may be, for example, formed of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first to third pixel electrodes may include three sub-layers formed of ITO/Ag/ITO.

Ends of the first to third pixel electrodes 211 to 213 are covered by the pixel-defining layer 120. The pixel-defining layer 120 may include openings corresponding to each pixel, for example, openings exposing central portions of the first to third pixel electrodes 120 to thereby define a pixel.

The pixel-defining layer 120 may be formed of an inorganic insulating material such as silicon nitride (SiNx, x>0), silicon oxide (SiOx, x>0), silicon oxynitride (SiOxNy, x>0, y>0), or silicon oxycarbide (SiOC). As shown in FIG. 3, in a process of manufacturing the display device in which an intermediate layer and an opposite electrode of each pixel are patterned in correspondence with a pixel electrode of the pixel; a part of the pixel-defining layer 120 may be exposed and not covered by a material of the intermediate layer or the opposite electrode. Oxygen or moisture may penetrate through a part of the exposed pixel-defining.layer 120. As a comparative example, when the pixel-defining layer is formed of an organic insulating material, the pixel-defining layer may provide a path via which moisture or oxygen may penetrate and an organic light-emitting diode may be damaged by the oxygen or the moisture. However, according to an embodiment, since the pixel-defining layer 120 is formed of an inorganic insulating material, the problem described above may be prevented or greatly reduced.

An auxiliary electrode 130 is arranged on the pixel-defining layer 120. The auxiliary electrode 130 may be arranged only on the pixel-defining layer 120. The auxiliary electrode 130 may directly contact an upper surface of the pixel-defining layer 120. The auxiliary electrode 130 may include a metal layer including low resistance metal, for example, Molybdenum (Mo), Titanium (Ti), copper (Cu), aluminum (Al), or an alloy thereof. Alternatively, the auxiliary electrode 130 may further include a transparent conductive oxide layer formed of a material such as ITO above and/or below the metal layer described above.

The first to third intermediate layers 221 to 223 are respectively arranged on the first to third pixel electrodes 211 to 213 exposed through an opening of the pixel-defining layer 120. The first to third intermediate layers 221 to 223 may each include a light-emitting layer emitting red, green, and blue light, for example, an organic emissive layer. The first to third intermediate layers 221 to 223 may each include a functional layer above and/or below the light-emitting layer. The functional layer may include at least one among a hole injection layer (HIL), a hole transport layer (HTL), an electron transport layer (ETL), and an electron injection layer (EIL). The first intermediate layer 221. the second intermediate layers 222, and the third intermediate layer 223 are spaced apart from each other. Similarly, sub-layers (e.g. light-emitting layer. HIL, HTL. ETL, and/or EIL) of the first intermediate layer 221 are spaced apart from those of the second intermediate layer 222 and those of the third intermediate layer 223.

The first to third opposite electrodes 231 to 233 are arranged on the first to third intermediate layers 221 to 223, respectively. The first to third opposite electrodes 231 to 233 may be formed of a conductive material with a low work function. For example, the first to third opposite electrodes 231 to 233 may include Ag, Mg, Al, Pt, Pd, Au, Ni, Nd, Ir, Cr, lithium (Li), calcium (Ca), or an alloy thereof. In an embodiment, the first to third opposite electrodes 231 to 233 may include Al, Ag, or an alloy of Mg and Ag (Mg:Ag). In an embodiment, the first to third opposite electrodes 231 to 233 may include an alloy containing Ag more than Mg.

Although the first to third opposite electrodes 231 to 233 are patterned in correspondence with the first to third pixel electrodes 211 to 213 respectively and spaced apart from each other, the first to third opposite electrodes 231 to 233 may be electrically connected to each other via the auxiliary electrode 130. Ends of the first to third opposite electrodes 231 to 233 may extend further than ends of the first to third intermediate layers 221 to 223 to thereby directly contact the auxiliary electrode 130.

Figure 4A:
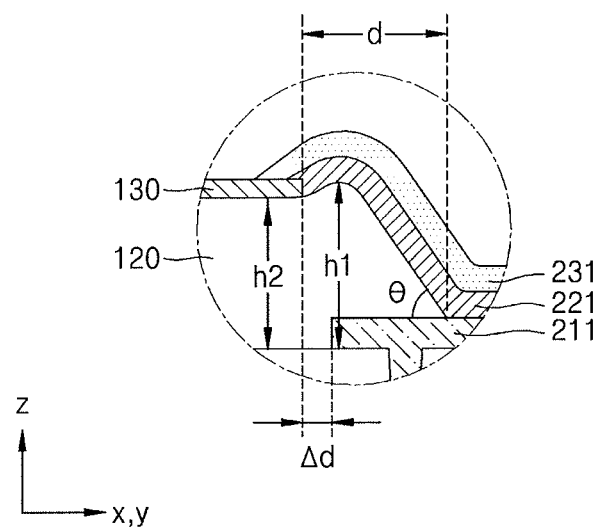
FIG. 4A illustrates an expanded view of the surroundings of a slope of a pixel-defining layer according to an embodiment.
Figure 4B:
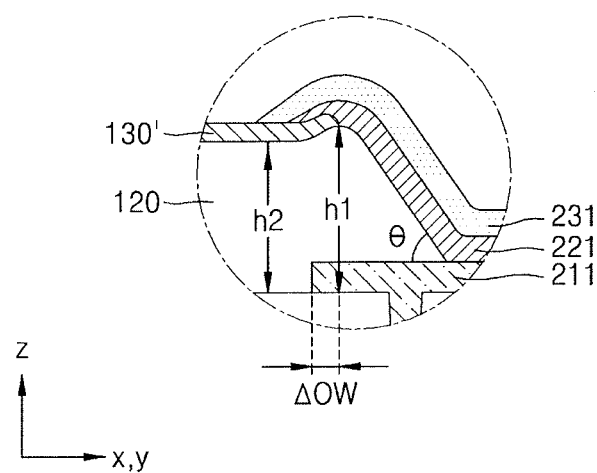
FIG. 4B illustrates an expanded view of the surroundings of a slope of a pixel-defining layer according to another embodiment.

FIG. 4A is an expanded view of a periphery of a slope of the pixel-defining layer 120 according to an embodiment. FIG. 4B is an expanded view of a periphery of a slope of the pixel-defining layer 120 according to another embodiment. FIGS. 4A and 4B may each correspond to an area IV of FIG. 3.

Referring to FIG. 4A, the pixel-defining layer 120 is formed of an inorganic insulating material and covers the end of the first pixel electrode 211. The auxiliary electrode 130 is arranged on the pixel-defining layer 120. An end of the auxiliary electrode 130 may be spaced apart from a point at which the slope of the pixel-defining layer 120 contacts an upper surface of the first pixel electrode 211 by a distance "d". Accordingly, a lateral current leakage may be prevented. In an embodiment, the distance "d" described above may be about 2 μm to 3 μm.

As the pixel-defining layer 120 is formed of the inorganic insulating material, a mound protruding toward an upper surface of the pixel-defining layer 120 may be formed on a portion of the pixel-defining layer 120 corresponding to an end of a pixel electrode. In relation to this, FIG. 4A illustrates that the mound on the pixel-defining layer 120 is arranged in a position corresponding to the end of the first pixel electrode 211, and that a height h1 from the insulating layer 110 to the mound (e.g., a peak of the mound) is greater than a height h2 from the insulating layer 110 to an upper surface of the pixel-defining layer 120 that does not overlap the first pixel electrode 211 along the z-axis. An angle θ of the slope of the pixel-defining layer 120 may be less than about 70 degrees, but large enough to provide a mound having a peak that overlaps a portion of the first pixel electrode 211 along the z-axis.

The auxiliary electrode 130 may be formed to cover a portion of the upper surface of the pixel-defining layer 120. As shown in FIG. 4A, an end of the auxiliary electrode 130 may be spaced apart from a pixel electrode, for example, the end of the first pixel electrode 211 by a certain distance Δd, e.g., a distance large enough such that the end of the auxiliary electrode 130 does not overlap the mound of the pixel-defining layer 120 or the first intermediate layer 221 along the z-axis. Alternatively, as shown in FIG. 4B, an end of an auxiliary electrode 130' may overlap the end of the first pixel electrode 211 in correspondence with a width ΔOW such that the end of the auxiliary electrode 130' also overlaps the first intermediate layer 221, e.g., under first intermediate layer 221, and the mound of the pixel-defining layer 120 along the z-axis.

Figure 5:
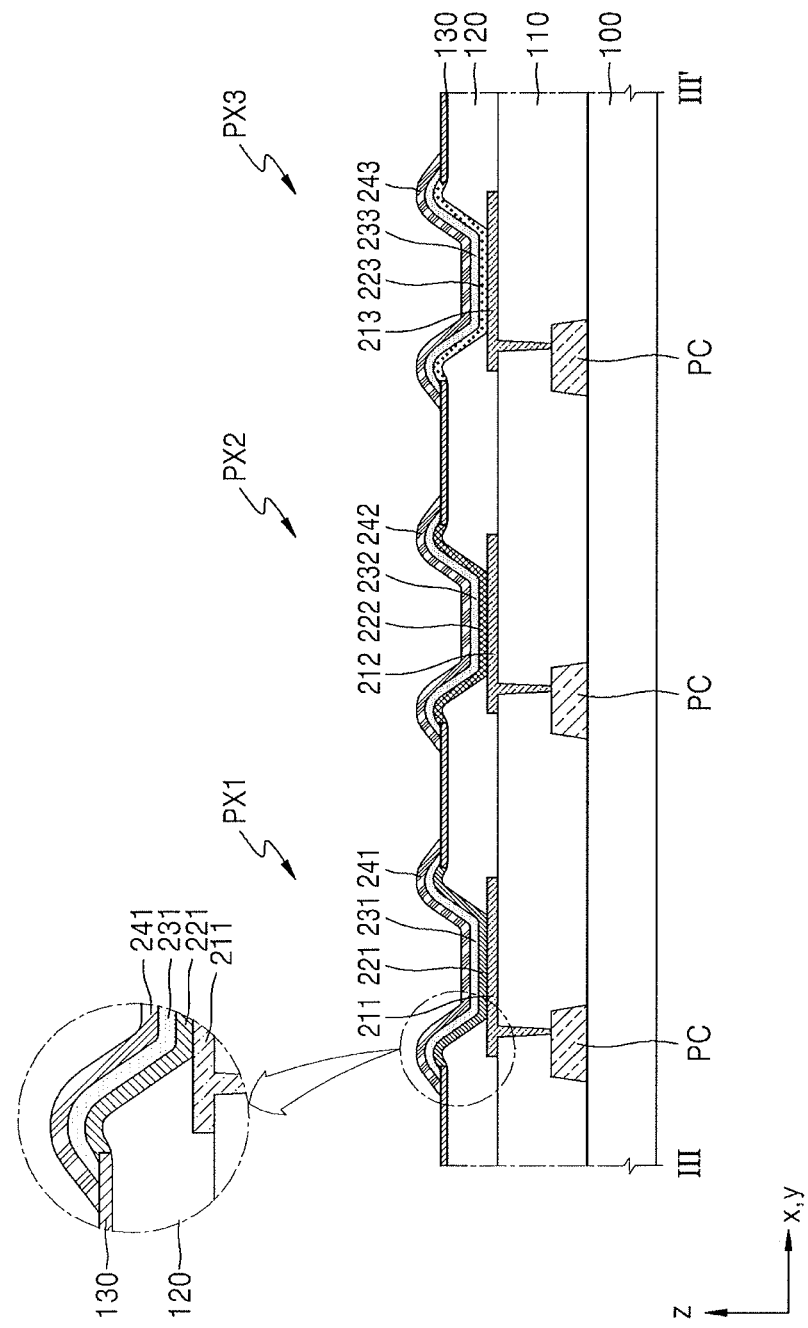
FIG. 5 illustrates a cross-sectional view of a display device according to another embodiment.

FIG. 5 is a cross-sectional view of a display device according to another embodiment. Unlike the display described above with reference to FIG. 3, the display device of FIG. 5 may further cover a conductive protective layer covering an opposite electrode. Components other than the conductive protective layer are described with reference to FIGS. 3, 4A, and 4B. Thus, a difference between FIG. 3 and FIG. 5 will be described hereinafter.

During or after a process, the conductive protective layer may protect a layer (or layers) below the conductive protective layer, e.g., an opposite electrode, an intermediate layer, or the like. In relation to this, FIG. 5 shows first to third conductive protective layers 241 to 243, each patterned in each pixel.

The first to third conductive protective layers 241 to 243 are spaced apart from each other, and may be patterned on the first to third opposite electrodes 231 to 233 respectively. The first to third conductive protective layers 241 to 243 may cover the whole first to third opposite electrodes 231 to 233 respectively. For example, the first conductive protective layer 241 may entirely cover the first opposite electrode 231. Likewise, the second conductive protective layer 242 may entirely cover the second opposite electrode 232. The third conductive protective layer 243 may entirely cover the third opposite electrode 233.

The first to third conductive protective layers 241 to 243 may include a transparent conductive material with high electrical conductivity and a low water vapor transmission rate (WVTR), through which light emitted from the light-emitting layer is transmitted. For example, the first to third conductive protective layers 241 to 243 may include transparent conductive oxide such as ITO, IZO, ZnO, $In_2O_3$, IGO, or AZO. The first to third conductive protective layers 241 to 243 may have a thickness of about 10 Å to about 1 μm.

A width, e.g., along the x-axis and the y-axis of the first to third conductive protective layers 241 to 243 may be greater than a width of the first to third opposite electrodes 231 to 233. In relation to this, the expanded view of FIG. 5 illustrates that an end of the first conductive protective layer 241 may extend beyond an end of the first opposite electrode 231 such that the first conductive protective layer 241 contacts an upper surface of the first opposite electrode 231. The end of the first conductive protective layer 241 may contact the auxiliary electrode 130. Likewise, an end of the second conductive protective layer 242 may extend beyond an end of the second opposite electrode 232, and an end of the third conductive protective layer 243 may extend beyond an end of the third opposite electrode 233. The first conductive protective layer 241 may function as a medium connecting the first opposite electrode 231 to the auxiliary electrode 130. Similarly, the each of second and third conductive protective layers 242 and 243 may function as a medium connecting the each of second and third opposite electrodes 232 and 233 to the auxiliary electrode 130, respectively.

Figure 6:
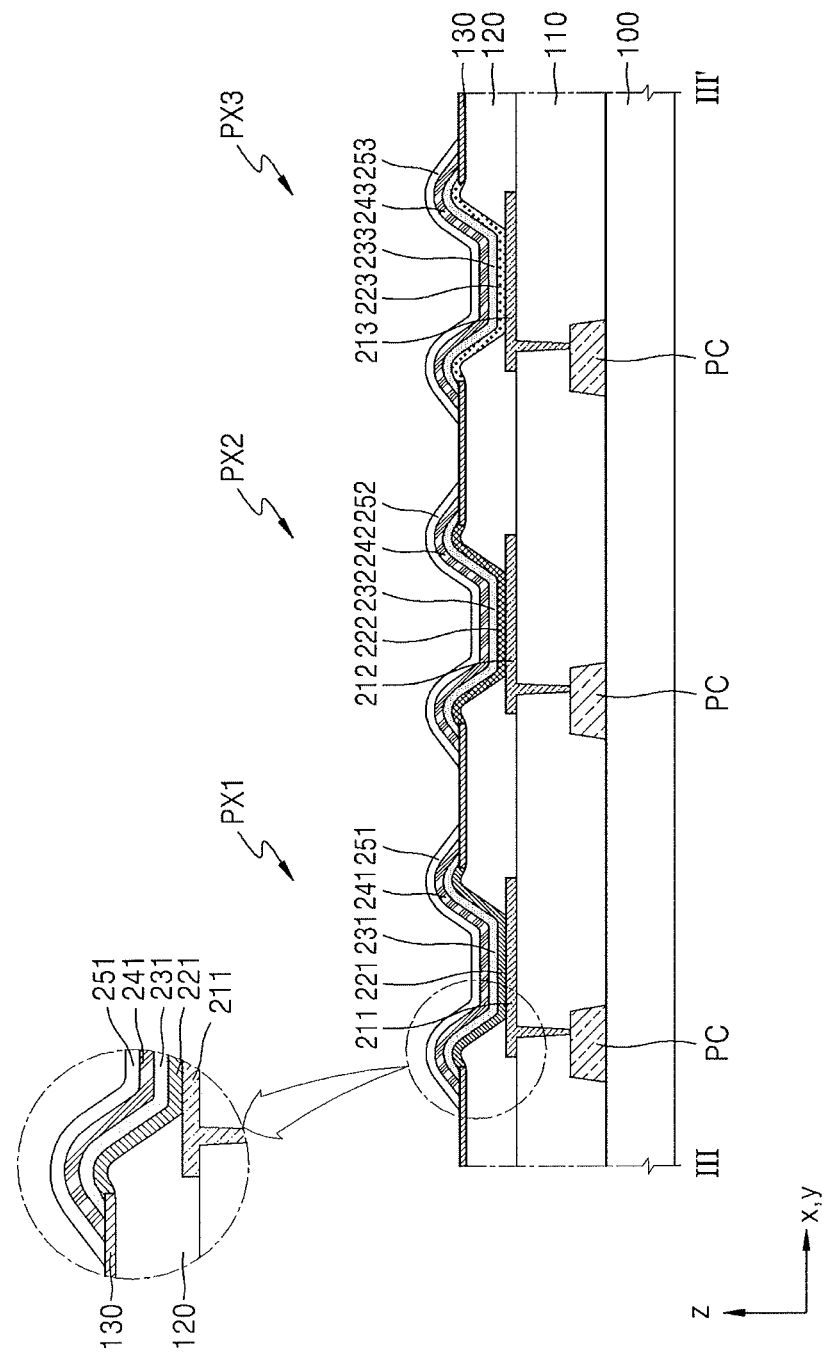
FIG. 6 illustrates a cross-sectional view of a display device according to another embodiment.

FIG. 6 is a cross-sectional view of a display device according to another embodiment. Unlike the display device described above with reference to FIG. 5, the display device of FIG. 6 may further include an insulating protective layer. Components other than the insulating protective layer are described with reference to FIGS. 3, 4A, 4B, and 5. Thus, a difference between FIGS. 3, 4A, 4B, and 5 and FIG. 6 will be described hereinafter.

During or after a process, the insulating protective layer may protect a layer (or layers) below the insulating protective layer, e.g., a conductive protective layer, an opposite electrode, an intermediate layer, or the like. In relation to this, FIG. 6 shows first to third insulating protective layers 251 to 253, each patterned in each pixel.

The first to third insulating protective layers 251 to 253 are spaced apart from each other, and may be patterned on the first to third conductive protective layers 241 to 243 respectively. The first to third insulating protective layers 251 to 253 may cover the whole first to third opposite electrodes 241 to 243 respectively. Widths, e.g., along the x-axis and y-axis, of the first to third insulating protective layers 251 to 253 may be greater than widths of the first to third conductive protective layers 241 to 243 respectively.

Referring to the expanded view of FIG. 6, an end of the first insulating protective layer 251 may extend beyond an end of the first conductive protective layer 241 and contact the auxiliary electrode 130. Similarly, an end of the second conductive protective layer 252 may extend beyond an end of the second conductive protective layer 242 and contact the auxiliary electrode 130. An end of the third conductive protective layer 253 may extend beyond an end of the third conductive protective layer 243 and contact the auxiliary electrode 130. The first to third insulating protective layers 251 to 253 may include an inorganic insulating material such as silicon nitride, silicon oxide. etc.

Figure 7:
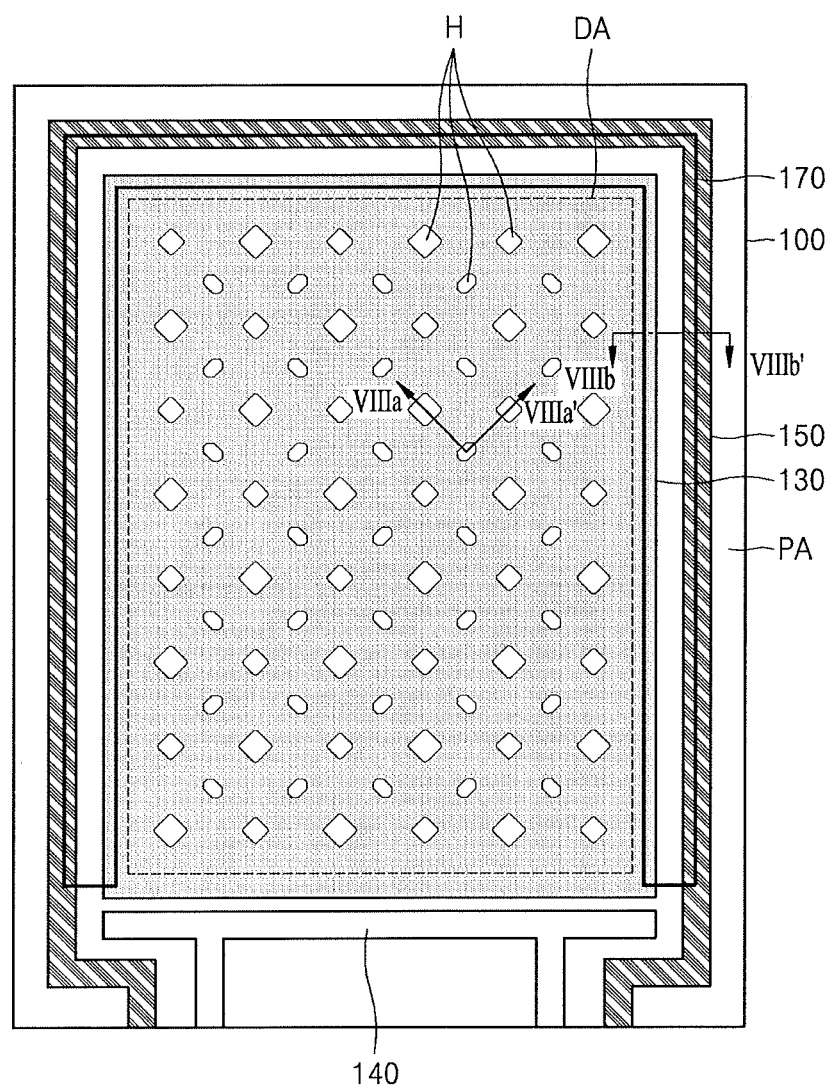
FIG. 7 illustrates a plan view of an electrical connection of an auxiliary electrode to a power voltage supply line in the display device according to an embodiment.

FIG. 7 is a plan view illustrating an electrical connection of the auxiliary electrode 130 to a power voltage supply line in the display device according to an embodiment. A first power voltage supply line 140 and a second power voltage supply line 150 are arranged in the peripheral area PA of the substrate 100. The first power voltage supply line 140 provides the first power voltage ELVDD to each pixel of the display DA and the second power voltage supply line 150 provides the second power voltage ELVSS to each pixel of the display DA.

In relation to this, FIG. 7 illustrates that the first power voltage supply line 140 is adjacent to a side of the substrate 100 and extends along the x-axis, and the second power voltage supply line 150 extends along edges, e.g., along sides of the substrate 100 that are not adjacent to the first power voltage supply line 140, of the substrate 100 to partially surround the display area DA. For example, the second power voltage supply line 150 may extend along the x-axis and the y-axis to partially surround the display area DA along three sides of the substrate 100.

FIG. 7 illustrates that the first power voltage supply line 140 is arranged adjacent to a side of the substrate 100. Alternatively, in a large display device, the first power voltage supply lines 140 may be arranged in a symmetrical form to have the display area DA at a center thereof to prevent a voltage drop in a wire supplying a first power voltage.

The auxiliary electrode 130 may be arranged in the display area DA. The auxiliary electrode 130 includes pixels of the display area DA, for example. holes H corresponding to a pixel electrode. The holes H may be spaced apart from each other and the auxiliary electrode 130 may be formed as one body. Each of the holes H overlaps each of the pixel electrodes. The auxiliary electrode 130 may have a size corresponding to an area of the display area DA, other than an area of the holes H, and thus may reduce its own resistance. Therefore, in both small and large display devices, the auxiliary electrode 130 may greatly reduce a voltage drop and provide the second power voltage ELVSS to an opposite electrode of each pixel. A problem caused by the voltage drop may be effectively prevented by using low-resistance metal including Mo, Ti, Cu, or the like as the auxiliary electrode 130.

The auxiliary electrode 130 may be partially surrounded by the second power voltage supply line 150. In relation to this, FIG. 7 illustrates that the second power voltage supply line 150 extends along three sides of the auxiliary electrode 130 having a rectangular shape to thereby surround a part of the auxiliary electrode 130. The auxiliary electrode 130 is spaced apart from the second power voltage supply line 150 and electrically connected to the second power voltage supply line 150 by a connection electrode layer 170.

The connection electrode layer 170 may extend along an edge of the auxiliary electrode 130. For example, as shown in FIG. 7, the connection electrode layer 170 extends along three sides of the auxiliary electrode 130 having a rectangular shape and has an open loop shape of which a side is open. The connection electrode layer 170 may be arranged on the auxiliary electrode 130 and the second power voltage supply line 150, and overlap a part of the auxiliary electrode 130 and a part of the second power voltage supply line 150 along the z-axis.

Figure 8:
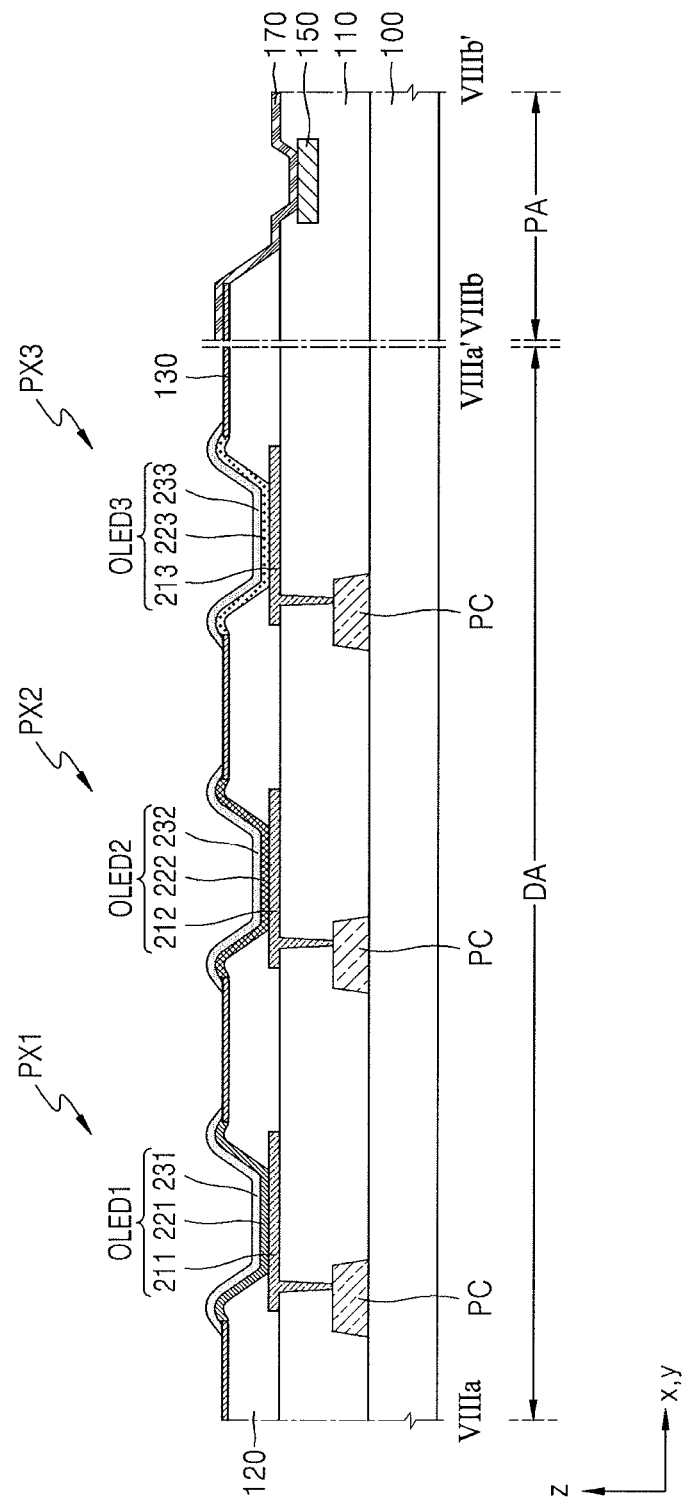
FIG. 8 illustrates a cross-sectional view of the display device according to an embodiment.

FIG. 8 is a cross-sectional view of the display device according to an embodiment. FIG. 8 corresponds to lines VIIIa-VIIIa' and VIIIb-VIIIb' of FIG. 7.

A cross section according to the line VIIIa-VIIIa' of FIG. 8 shows the display area DA. The first to third organic light-emitting diodes OLED1 to OLED3 are arranged in the display area DA. Structures of the first to third organic light-emitting diode OLED1 to OLED3 and the auxiliary electrode 130 each arranged in the display area DA are described above with reference to FIGS. 3 to 4B. Thus, the peripheral area PA is described hereinafter.

Referring to the cross-section according to a line VIIIb-VIIIb' of FIG. 8, the second power voltage supply line 150 is arranged in the peripheral area PA. In an embodiment, edges of the second power voltage supply line 150 may be covered by the insulating layer 110 and a portion of the second power voltage supply line 150 may be exposed through a hole of the insulating layer 110.

In the display area DA, the first to third opposite electrodes 231 to 233 that are spaced apart from each other may be electrically connected to each other via the auxiliary electrode 130 on the pixel-defining layer 120. The auxiliary electrode 130 may be arranged only on the pixel-defining layer 120. Thus, an end of an edge of the auxiliary electrode 130 is spaced apart from the second power voltage supply line 150. The auxiliary electrode 130 is electrically connected to the second power voltage supply line 150 by the connection electrode layer 170.

The connection electrode layer 170 may be arranged above the auxiliary electrode 130 and the second power voltage supply line 150 to thereby cover a portion of the auxiliary electrode 130 and a portion the second power voltage supply line 150 along the z-axis. For example, a first portion (e. g., an inner edge portion) of the connection electrode layer 170, adjacent to the display area DA, may directly contact the outer edge end of the auxiliary electrode 130. A second portion (e. g., an outer edge portion) of the connection electrode layer 170, located away from the display area DA, may directly contact the second power voltage supply line 150. FIG. 8 illustrates that the connection electrode layer 170 directly contacts the second power voltage supply line 150. However, in another embodiment, a conductive layer may be further arranged between the second power voltage supply line 150 and the connection electrode layer 170. The conductive layer may be on a same layer as that of a pixel electrode and formed of a same material as that of the pixel electrode.

The connection electrode layer 170 may include a material different from that of the first to third opposite electrodes 231 to 233. The connection electrode layer 170 may include metal or a transparent conductive material having excellent electrical conductivity and a low WVTR. In an embodiment, the connection electrode layer 170 may be formed of a transparent conductive material such as ITO, IZO, ZnO, In$_2$O$_3$, IGO, or AZO. The first to third connection electrode layer 170 may have a thickness of about 10 Å to about 1 µm.

Figure 9:
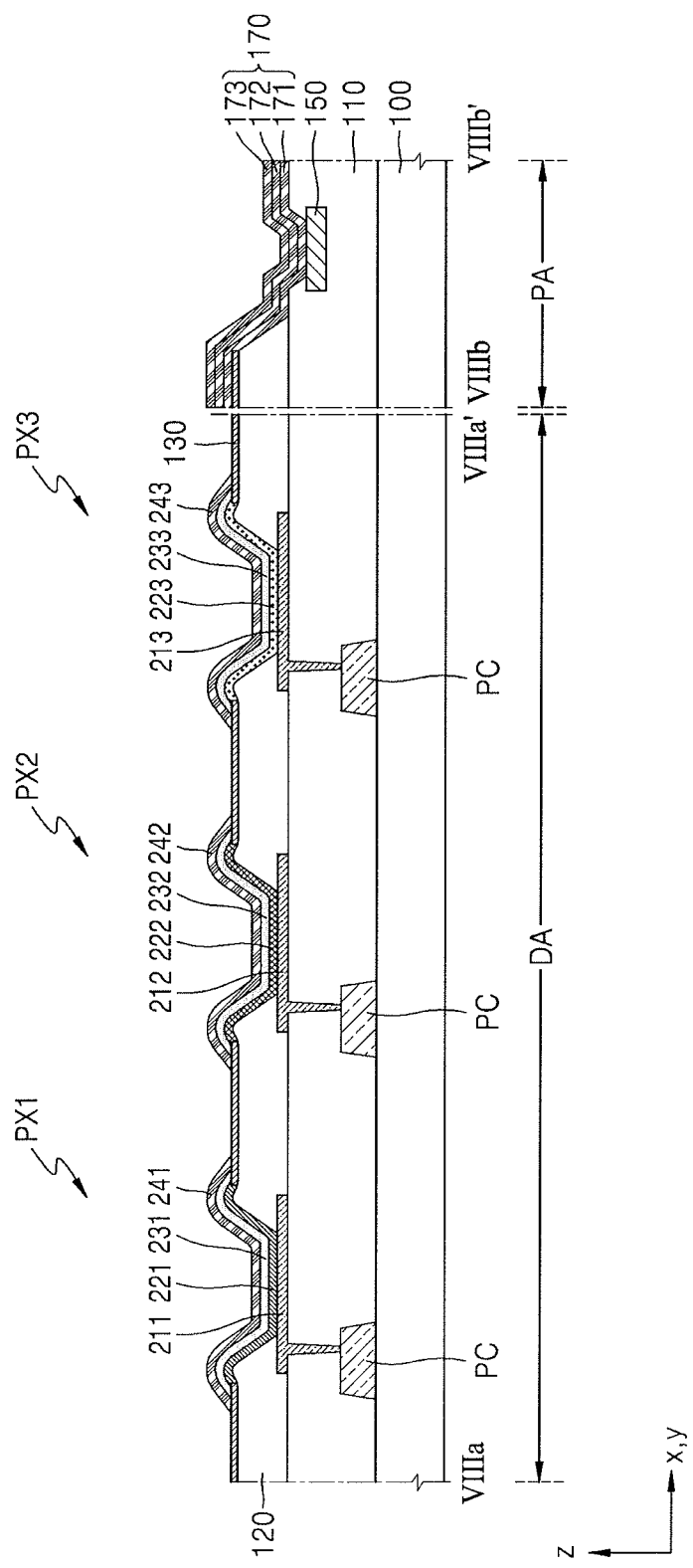
FIG. 9 illustrates a cross-sectional view of the display device according to another embodiment.

FIG. 9 is a cross-sectional view of the display device according to another embodiment. FIG. 9 corresponds to lines VIIIa-VIIIa' and VIIIb-VIIIb' of FIG. 7.

A cross section according to the line VIIIa-VIIIa' of FIG. 9 corresponds to the display area DA. The display area DA includes the first to third pixel electrodes 211 to 213, the first to third intermediate layers 221 to 223, the first to third opposite electrodes 231 to 233, the first to third conductive protective layers 241 to 243, and the auxiliary electrode 130, which are described above with reference to FIG. 5. Thus, the peripheral area PA is described hereinafter.

Referring to the cross-section according to a line VIIIb-VIIIb' of FIG. 9, the connection electrode layer 170 may be formed of a plurality of layers. The connection electrode layer 170 may include first to third electrode layers 171 to 173 sequentially stacked.

The first to third electrode layers 171 to 173 may include same materials as those of the first to third conductive protective layers 241 to 243 each patterned on the display area DA. For example, since the first electrode layer 171 may be formed in a process of patterning the first conductive protective layer 241, a material of the first electrode layer 171 may be same as that of the first conductive protective layer 241. Likewise, materials of the second and third electrode layers 172 and 173 may be same as those of the second and third conductive protective layers 242 and 243 respectively. The first to third electrode layers 171 to 173 may each include a transparent conductive material such as ITO, IZO, ZnO, In$_2$O$_3$, IGO, or AZO.

FIG. 9 illustrates that the connection electrode layer 170 is formed of three layers. Alternatively, the connection electrode layer 170 may include one or two layers selected from the first to third electrode layers 171 to 173.

Figure 10:
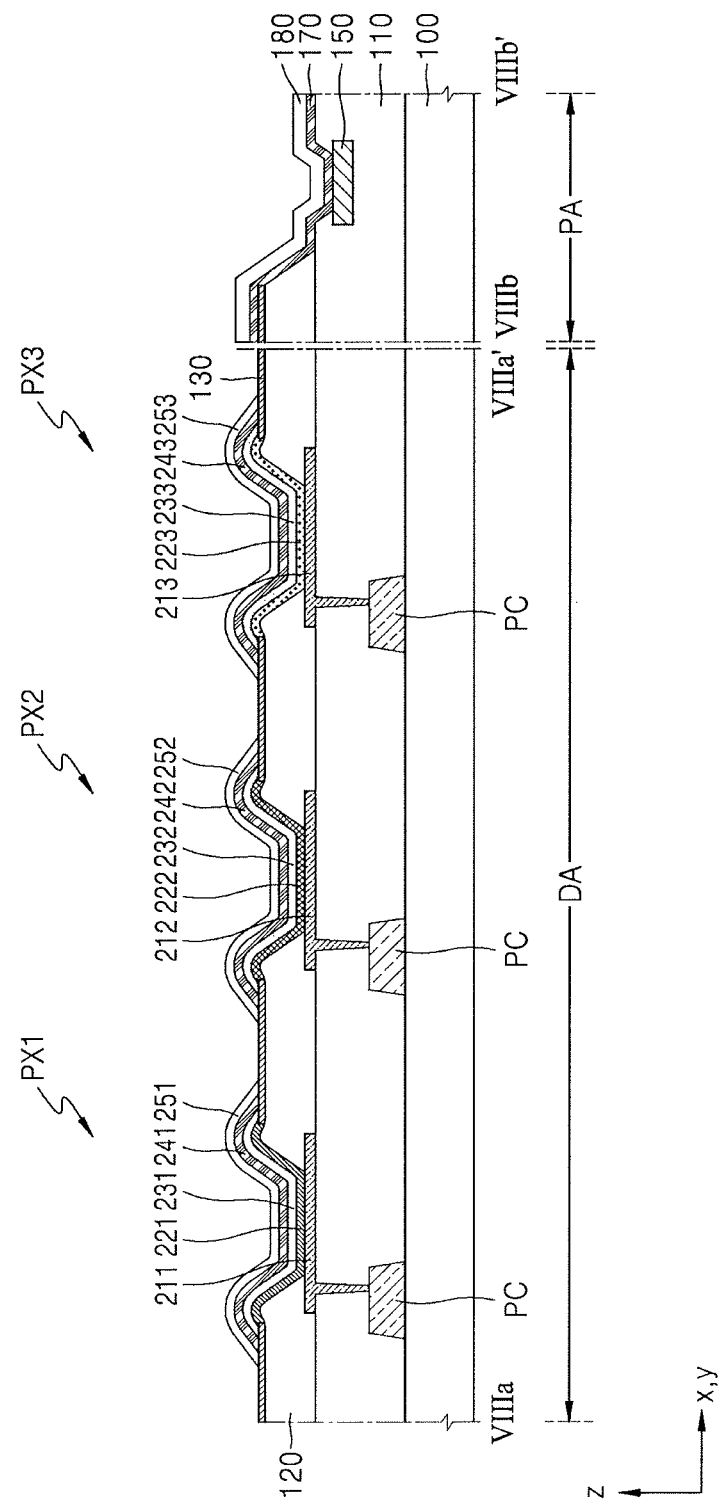
FIG. 10 illustrates a cross-sectional view of the display device according to another embodiment.

FIG. 10 is a cross-sectional view of the display device according to another embodiment. FIG. 10 corresponds to lines VIIIa-VIIIa' and VIIIb-VIIIb' of FIG. 7.

A cross section according to a line VIIIa-VIIIa' of FIG. 10 corresponds to the display area DA. The display area DA includes the first to third pixel electrodes 211 to 213, the first to third intermediate layers 221 to 223, the first to third opposite electrodes 231 to 233, the first to third conductive protective layers 241 to 243, the first to third insulating protective layers 251 to 253, and the auxiliary electrode 130, which are described above with reference to FIG. 6. Thus, the peripheral area PA is described hereinafter.

Referring to the cross-section according to a line VIIIb-VIIIb' of FIG. 10, the auxiliary electrode 130 may be electrically connected to the second power voltage supply line 150 by the connection electrode layer 170. An insulating layer 180 may be arranged on the connection electrode layer 170. The insulating layer 180 may cover at least a part of the connection electrode layer 170.

The connection electrode layer 170 may be a single layer. The connection electrode layer 170 may be formed in a process of patterning one of the first to third conductive protective layers 241 to 243 each patterned on the display area DA. Accordingly, a material of the connection electrode layer 170 may be same as a material of one of the first to third conductive protective layers 241 to 243. As an embodiment, the connection electrode layer 170 may be formed in a same process as that of patterning a conductive protective layer that is patterned last among the first to third conductive protective layers 241 to 243. In this case, a material of the connection electrode layer 170 may be same as that of the conductive protective layer patterned last and described above.

The insulating layer 180 may include an inorganic insulating material. For example, the insulating layer 180 may be formed in a process of patterning one of the first to third insulating protective layers 251 to 253 on the display area DA. Accordingly, a material of the insulating layer 180 may be same as a material of one of the first to third insulating protective layers 251 to 253. For example, the insulating layer 180 may be formed in a process of patterning an insulating protective layer that is last among the first to third protective layers 251 to 253 to be formed, and may include a same material as that-of the insulating protective layer patterned last.

Each of the first to third conductive protective layers 241 to 243 and each of the first to third insulating protective layers 251 to 253 may be patterned sequentially on the display area DA. For example, the first conductive protective layer 241 may be patterned, and then, the first insulating protective layer 251 may be patterned. Likewise, the second conductive protective layer 242 may be patterned, and then, the second insulating protective layer 252 may be patterned. In addition, the third conductive protective layer 243 may be patterned, and then, the third insulating protective layer 253 may be patterned. In this case, the connection electrode layer 170 and the insulating layer 180 may include same materials as those of a conductive protective layer and an insulating protective layer both corresponding to a pixel of the display area DA.

As an embodiment, the connection electrode layer 170 and the insulating layer 180 may each include same materials as those of the first conductive protective layer 241 and the first insulating protective layer 251 respectively. Alternatively, the connection electrode layer 170 and the insulating layer 180 may include same materials as those of the second conductive protective layer 242 and the second insulating protective layer 252 respectively, or include same materials as those of the third conductive protective layer 243 and the third insulating protective layer 253 respectively.

Figure 11:
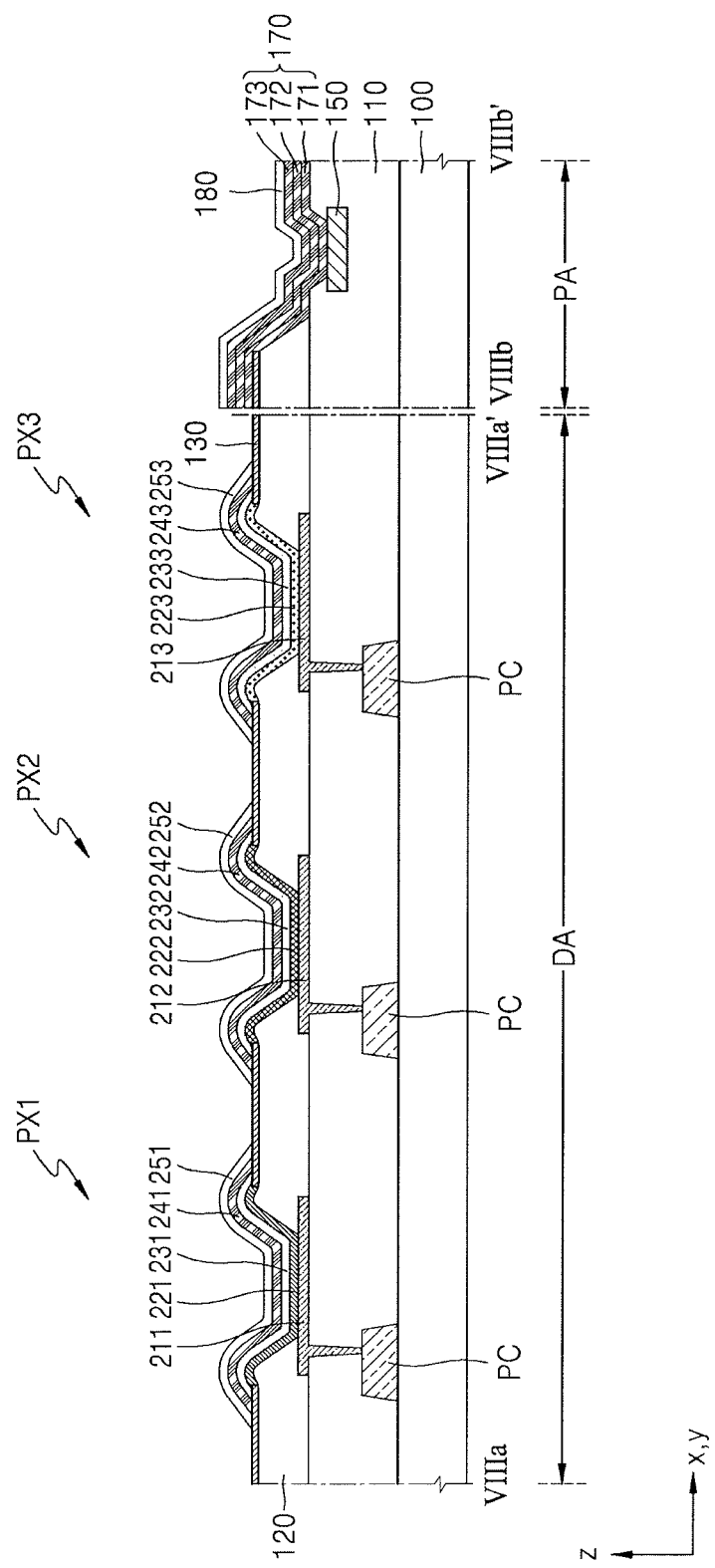
FIG. 11 illustrates a cross-sectional view of the display device according to another embodiment.

FIG. 11 is a cross-sectional view of the display device according to another embodiment. FIG. 11 illustrates a modified embodiment of the display device of FIG. 10. FIG. 11 corresponds to lines VIIIa-VIIIa' and VIIIb-VIIIb' of FIG. 7.

A cross section according to a line VIIIa-VIIIa' of FIG. 11 corresponds to the display area DA. The display area DA includes the first to third pixel electrodes 211 to 213, the first to third intermediate layers 221 to 223, the first to third opposite electrodes 231 to 233, the first to third conductive protective layers 241 to 243, the first to third insulating protective layers 251 to 253, and the auxiliary electrode 130, which are described above with reference to FIG. 6. Thus, the peripheral area PA is described hereinafter.

Referring to the cross-section according to a line VIIIb-VIIIb' of FIG. 11, unlike a description provided above with reference to the line VIIIb-VIIIb' of FIG. 10, the connection electrode layer 170 may have multiple layers. In relation to this, FIG. 11 illustrates that the connection electrode layer 170 includes the first to third electrode layers 171 to 173.

The first to third electrode layers 171 to 173 may include same materials as those of the first to third conductive protective layers 241 to 243 respectively patterned on the display area DA. Since the first electrode layer 171 may be formed in a process of patterning the first conductive protective layer 241, a material of the first electrode layer 171 may be same as that of the first conductive protective layer 241. Likewise, materials of the second and third electrode layers 172 and 173 may be same as those of the second and third conductive protective layers 242 and 243 respectively.

The insulating layer 180 may cover at least a part of the connection electrode layer 170. The insulating layer 180 may include an inorganic insulating material. The insulating layer 180 may include a same material as that of one of the first to third insulating protective layers 251 to 253.

The insulating layer 180 may be formed in a same mask process as that of the third electrode layer 173 arranged directly below the insulating layer 180. In this case, the third electrode layer 173 and the insulating layer 180 may include same materials as a material of one of the first to third conductive protective layers 241 to 243 and a material of an insulating protective layer arranged directly on the one of the first to third conductive protective layers 241 to 243. For example, when the third electrode layer 173 is patterned in a same process as that of the third conductive protective layer 243 and includes a same material as that of the third conductive protective layer 243, the insulating layer 180 may be patterned in a same process as that of the third insulating protective layer 253 and include a same material as that of the third insulating protective layer 253.

FIG. 11 illustrates that the connection electrode layer 170 includes three electrode layers. Alternatively, one of the first and second electrode layers 171 and 172 of FIG. 11 may not be included.

FIGS. 12 through 15C are cross-sectional views of the display device according to a process of manufacturing the display device according to an embodiment.

Figure 12:
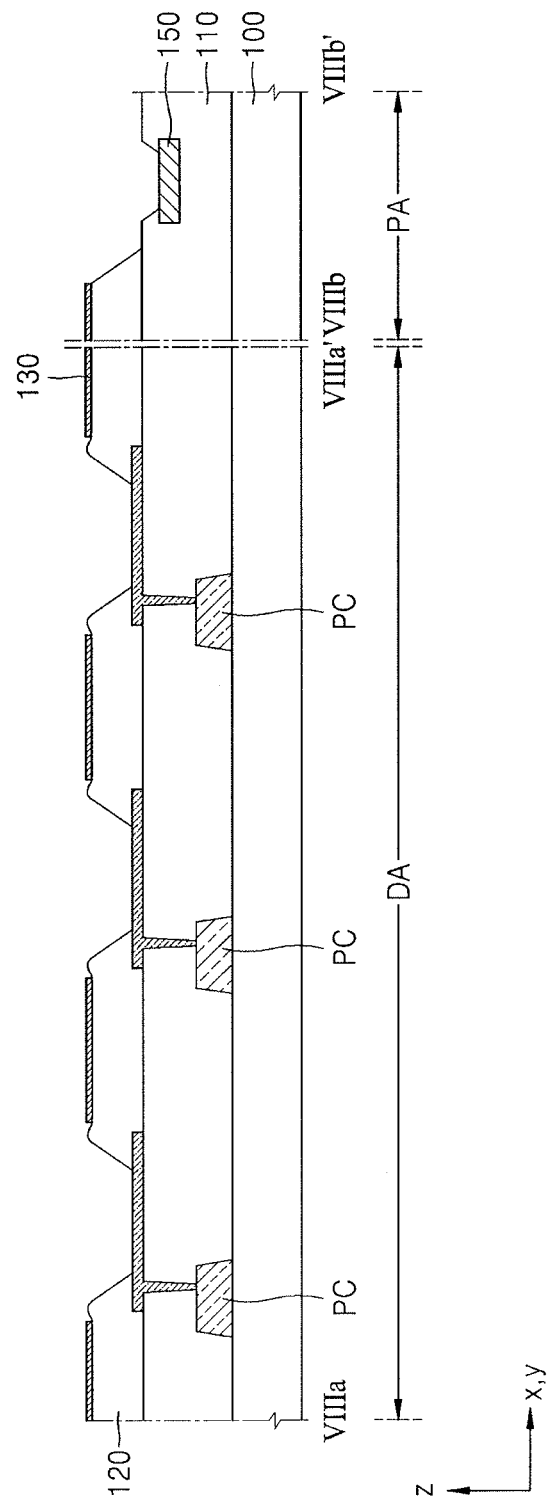
FIG. 12 illustrate a process of patterning pixel electrodes according to an embodiment.

Referring to FIG. 12, the pixel-defining layer 120 and the auxiliary electrode 130 are formed. Before the pixel-defining layer 120 and the auxiliary electrode 130 are formed, the pixel circuit PC and the second power voltage supply line 150 are formed on the substrate 100. Then, the insulating layer 110 is formed, and the first to third pixel electrodes 211 to 213 are formed over the insulating layer 110. The first to third pixel electrodes 211 to 213 may be, for example, patterned by using a method, for example, a wet-etching method.

The pixel-defining layer 120 and the auxiliary electrode 130 may be formed in a same mask process. For example, an inorganic insulating material layer and a metal material layer may be formed on the whole substrate 100 to cover the first to third pixel electrodes 211 to 213. Then, a photoresist having openings corresponding to the first to third pixel electrodes 211 to 213 may be formed. Then, the auxiliary electrode 130 is formed by etching (e.g., dry etching) the metal material layer, and the pixel-defining layer 120 is formed by etching (e.g., dry etching) the inorganic insulating material layer. Then, when the photoresist is removed, the pixel-defining layer 120 and the auxiliary electrode 130 remain as shown in FIG. 12.

Since the auxiliary electrode 130 is formed in a same mask process as that of the pixel-defining layer 120, damage to the pixel-defining layer 120 including an inorganic insulating material may be prevented, and the auxiliary electrode 130 may be arranged only on the pixel-defining layer 120. As a comparative example, when the pixel-defining layer 120 is formed, a metal material layer is formed on the pixel-defining layer 120, and then, the auxiliary electrode 130 is formed by etching the metal material layer, a selection rate of etching gas used to etch the auxiliary electrode 130 is low. Thus, the pixel-defining layer 120 may be damaged to thereby form a radical height difference on a slope of the pixel-defining layer 120. When an intermediate layer and an opposite electrode are formed on the pixel-defining layer 120 in which the radical height difference is formed, such a problem that the opposite electrode is broken may occur. However, according to an embodiment, since the auxiliary electrode 130 is etched, and then, the pixel-defining layer 120 is etched in a same process, the problem described above may be prevented or greatly reduced.

Figure 13A:
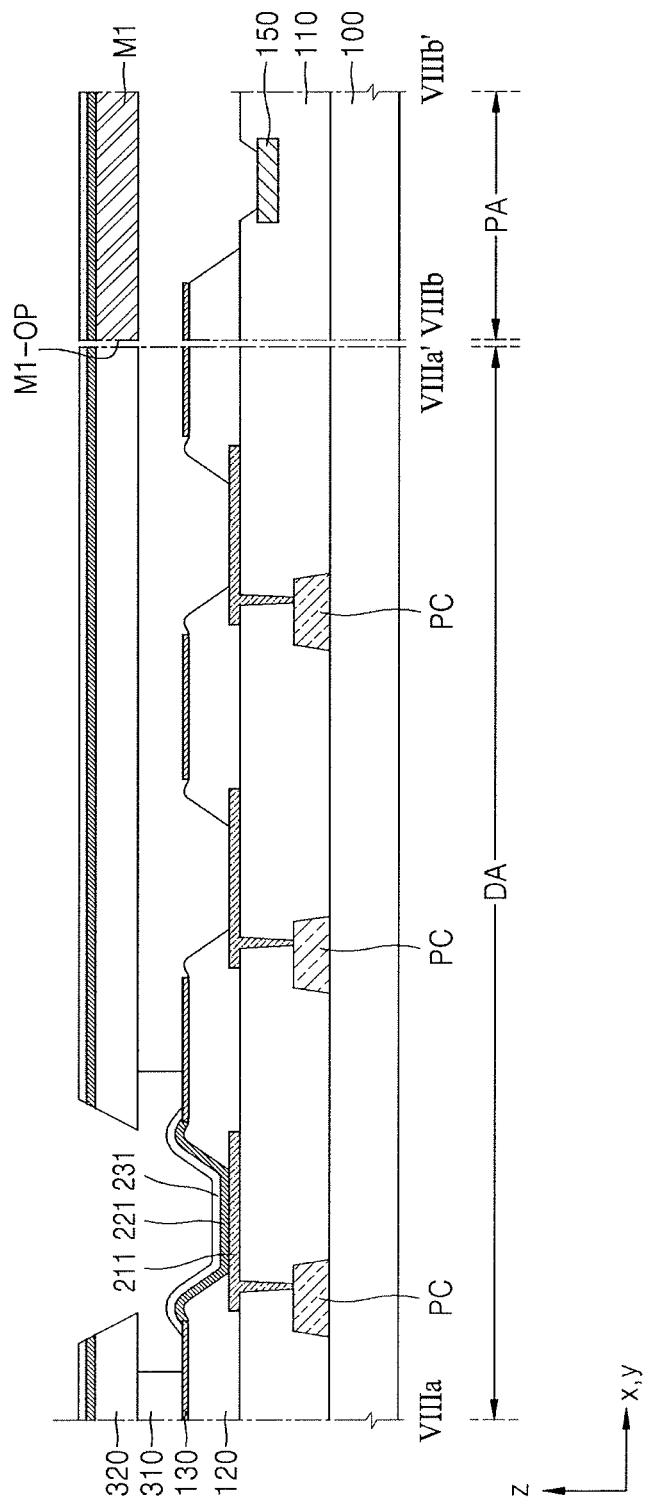
FIGS. 13A to 13C illustrate a process of patterning an area corresponding to a first pixel according to another embodiment.
Figure 13B:
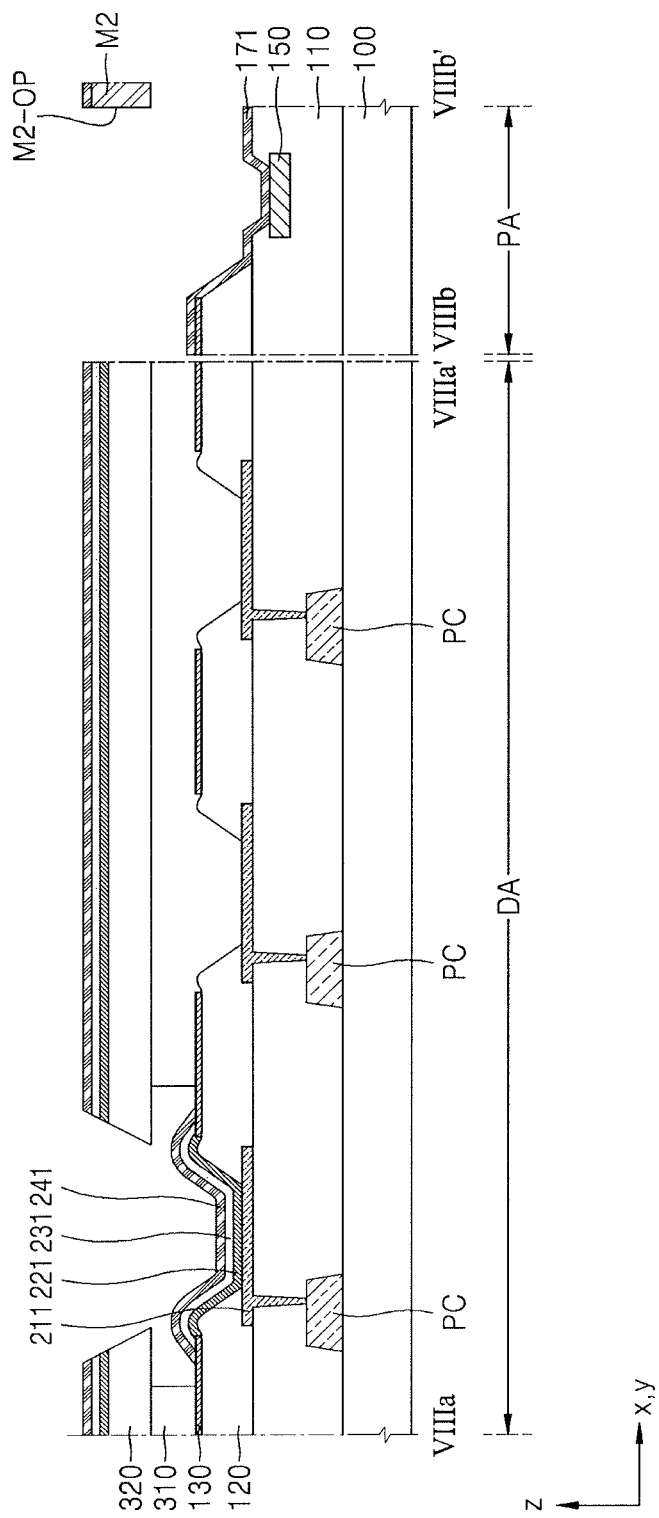
Figure 13C:
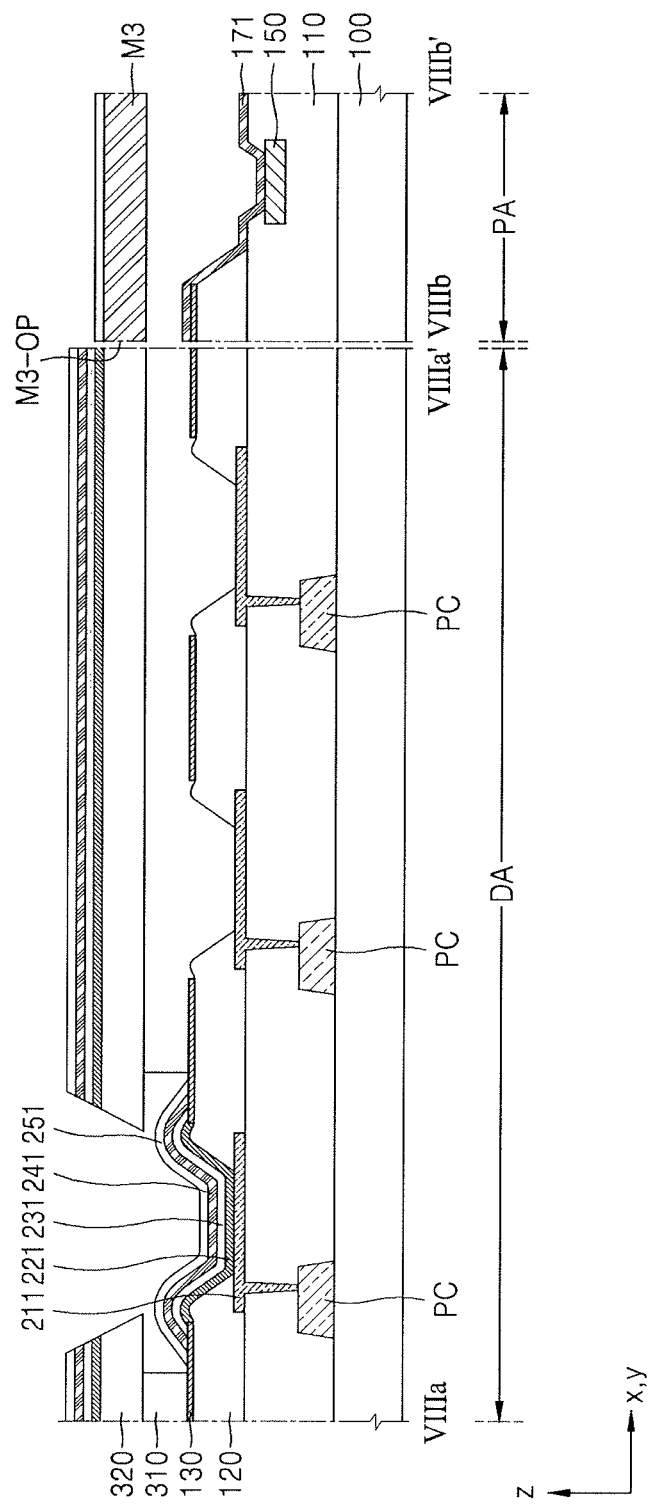

FIGS. 13A to 13C illustrate a process of patterning an area corresponding to a first pixel.

Referring to FIG. 13A, the first intermediate layer 221 and the first opposite electrode 231 are formed on the first pixel electrode 211. A first protective layer 310 and a first photosensitive resin layer 320 are formed in the display area DA. A first mask M1 may cover the peripheral area PA and include an opening M1-OP corresponding to the display area DA.

The first protective layer 310 and the first photosensitive resin layer 320 each may include an opening corresponding to the first pixel electrode 211. The opening in the first protective layer 310 may be greater than the opening in the first photosensitive resin layer 320.

As an embodiment, in the display area DA of the substrate 100 in which the pixel-defining layer 120 and the auxiliary electrode 130 are arranged, a non-photosensitive material layer and a photosensitive resin layer are formed. A part of the photoresist resin layer is exposed and etched to thereby form the first photosensitive resin layer 320 having an opening. Then, the first protective layer 310 having an opening may be formed by selectively removing the non-photosensitive material layer through the first photosensitive resin layer.

The non-photosensitive material layer may be formed of fluorinated resin. For example, the non-photosensitive material layer may include 75 to 95 wt % of fluoroether obtained by partially substituting hydrogen with fluorine in an ether structure, and 5 to 25 wt % of a resin polymer. When the non-photosensitive material layer includes the materials described above, part of the non-photosensitive material layer is removed by using a stripper in a form of a solution containing hydrofluoroether, etc., to thereby form the first protective layer 310 having an opening.

Then, the first intermediate layer 221 and the first opposite electrode 231. are formed on the substrate 100 in which and the first protective layer 310 and the first photosensitive resin layer 320 are arranged. Materials of the first intermediate layer 221 and the first opposite electrode 231 may be each formed on the first pixel electrode 211, as well as on the first photosensitive resin layer 320 or on the first mask M1.

The first intermediate layer 221 includes a light-emitting layer, and may have a structure further including an HIL, an HTL, an ETL, an HIL, etc. The first opposite electrode 231 may include metal having a low work function. A material of the metal is described above with reference to FIG. 3. The first intermediate layer 221 and the first opposite electrode 231 may be formed by using a thermal deposition method or the like.

A material of the first opposite electrode 231 may be deposited along a direction perpendicular to or inclined (or oblique) toward the substrate 100. Thus, the first opposite electrode 231 may cover the whole first intermediate layer 221 and contact the auxiliary electrode 130 in an opening of the first protective layer 310.

Referring to FIG. 13B, the first conductive protective layer 241 and the first electrode layer 171 may be formed. The first mask M1 is removed from the substrate 100 and the second mask M2 is arranged on the substrate 100. The second mask M2 includes an opening M2-OP corresponding to the display area DA that is greater than an opening M1-OP of the first mask M1. The second mask M2 may expose a portion of the peripheral area PA such that the second power voltage supply line 150 is exposed. Accordingly, an edge of the auxiliary electrode 130 and the second power voltage supply line 150 may be exposed.

Then, by depositing a material having an excellent electrical conductivity and a low WVTR, e.g., a transparent conductive oxide to correspond to a whole area of the substrate 100, the first conductive protective layer 241 and the first electrode layer 171 may be formed. The first conductive protective layer 241 and the first electrode layer 171 may be formed, for example, by using a sputtering method, etc.

The first conductive protective layer 241 may be formed to cover the whole first opposite electrode 231. Since a material of the first conductive protective layer 241 may be deposited along a direction perpendicular to or inclined toward the substrate 100, the first conductive protective layer 241 may be formed to cover the whole first opposite electrode 231 and contact the auxiliary electrode 130 in the opening of the first protective layer 310. The first electrode layer 171 is arranged on the auxiliary electrode 130 and the second power voltage supply line 150 that are spaced apart from each other to electrically connect the auxiliary electrode 130 to the second power voltage supply line 150.

Referring to FIG. 13C, the first insulating protective layer 251 may be formed. The second mask M2 is removed from the substrate 100 and a third mask M3 is arranged on the substrate 100. The third mask M3 includes an opening M3-OP corresponding to the display area DA that is smaller than the opening M2-OP of the second mask M2. For example, the opening M3-OP of the third mask M3 may have a same size as that of the first mask M1. Accordingly, an edge of the auxiliary electrode 130 and the second power voltage supply line 150 may be covered by the third mask M3.

Then, the first insulating protective layer 251 may be formed by depositing an inorganic insulating material on the substrate 100 to correspond to a whole area of the substrate 100. The first insulating protective layer 251 may include silicon nitride, silicon oxynitride, silicon oxide, etc. The first insulating protective layer 251 may be formed by using a chemical vapor deposition method, etc.

Since a material of the first insulating protective layer 251 is deposited along a direction perpendicular to or inclined toward the substrate 100, the first insulating protective layer 251 may cover the whole first conductive protective layer 241 and contact the auxiliary electrode 130 in an opening of the first protective layer 310.

Then, the first protective layer 310 is removed through a lift-off process. For example, the first protective layer 310 may be removed by using a solution containing hydrofluoroether. As the first protective layer 310 is removed, the first photosensitive resin layer 320 on the first protective layer 310 and a material deposited on the first photosensitive resin layer 320 are removed together. Accordingly, the first intermediate layer 221, the first opposite electrode 231, the first conductive protective layer 241, and the first insulating protective layer 251 remain on the first pixel electrode 211. The first electrode layer 171 connecting the auxiliary electrode 130 to the second power voltage supply line 150 remains in the peripheral area PA.

Figure 14A:
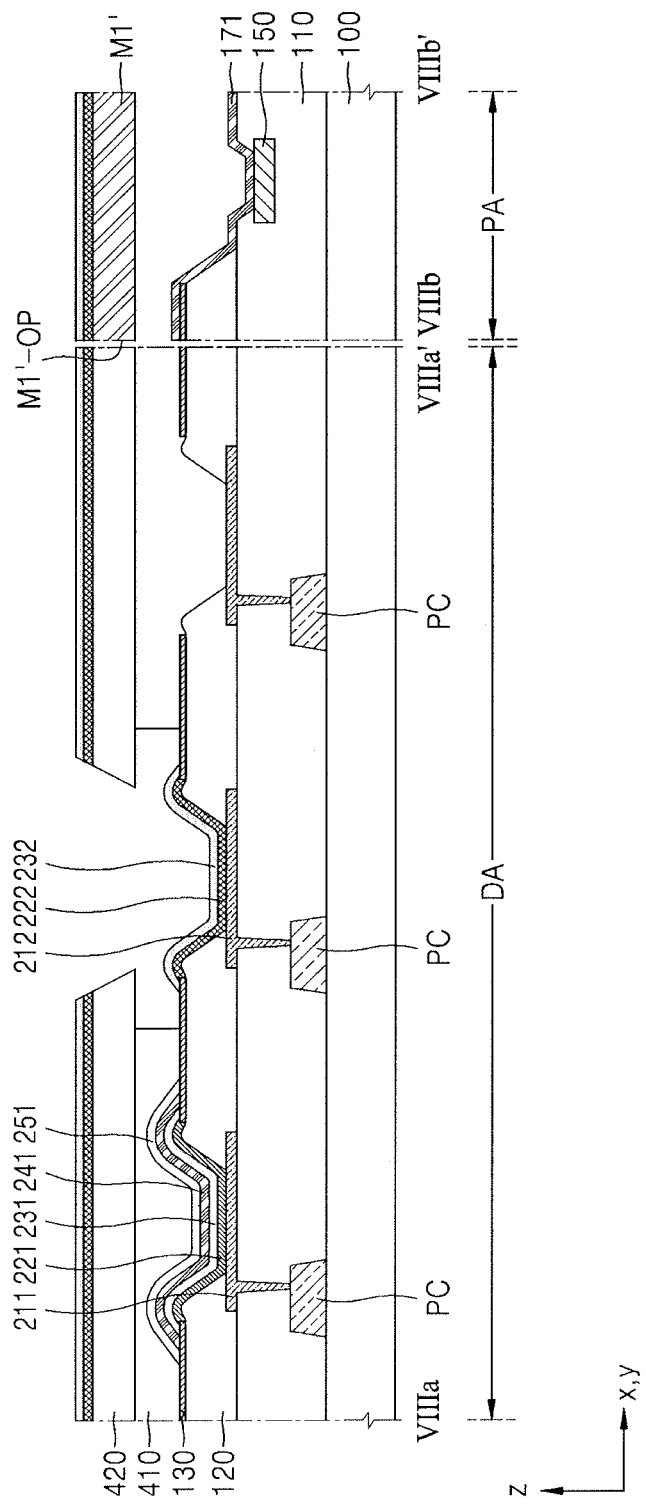
FIGS. 14A to 14C illustrate a process of patterning an area corresponding to a second pixel according to another embodiment.
Figure 14B:
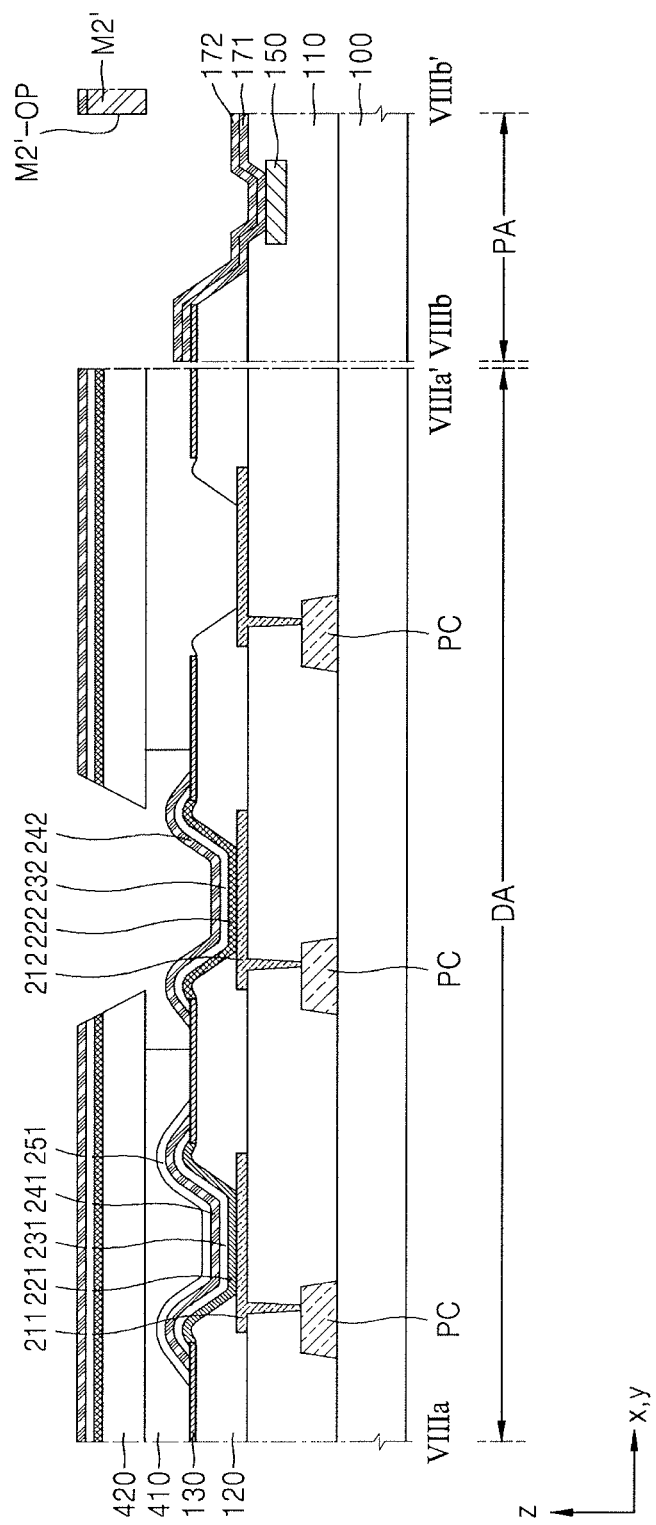
Figure 14C:
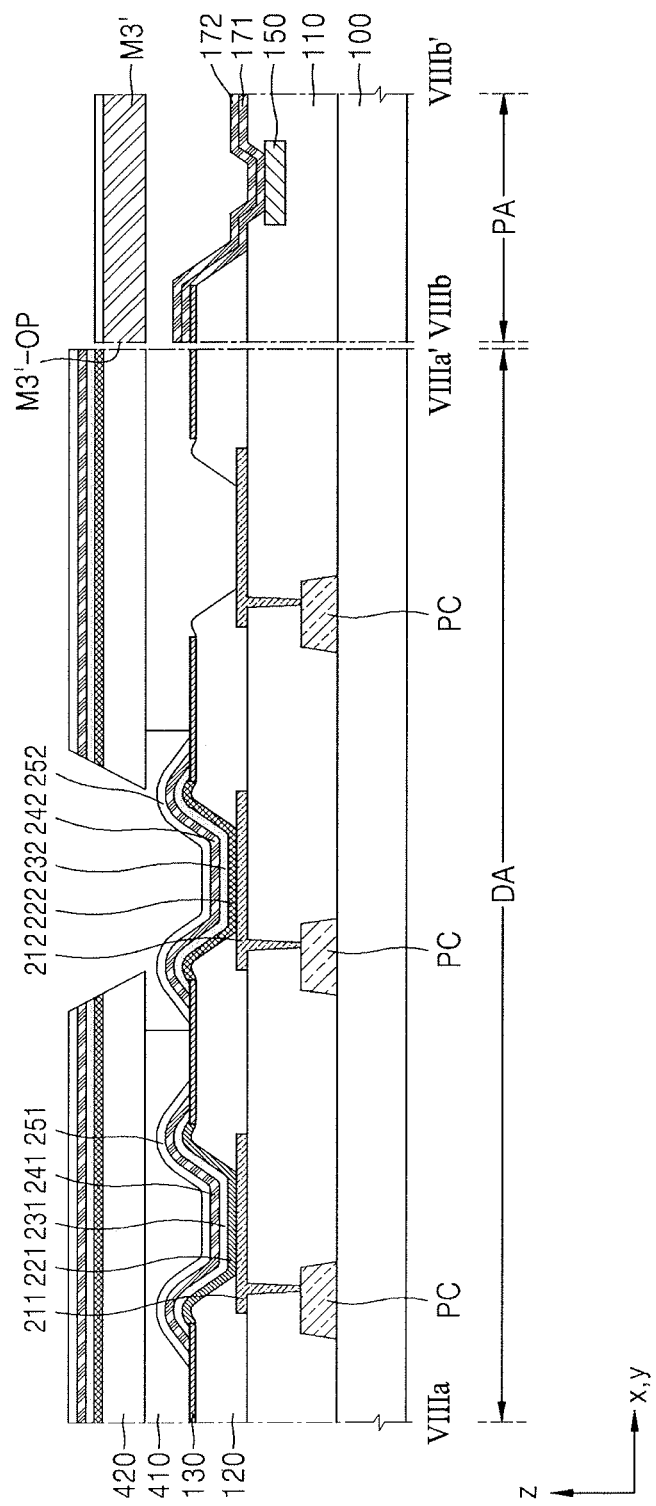

FIGS. 14A and 14C illustrate a patterning process performed in an area corresponding to a second pixel.

Referring to FIG. 14A, a second protective layer 410 including an opening corresponding to the second pixel electrode 212 is formed, and a second photosensitive resin layer 420 is formed on the second protective layer 410. A first mask M1' may cover the peripheral area PA and include an opening M1'-OP corresponding to the display area DA. The second protective layer 410 is formed of a non-photosensitive material, e.g., fluorinated resin. A detailed description thereof is provided above with reference to the first protective layer 310.

Then, the second intermediate layer 222 and the second opposite electrode 232 are formed on the substrate 100 on which the second protective layer 410 and the second photosensitive resin layer 420 are arranged. Materials of the second intermediate layer 222 and the second opposite electrode 232 may be each arranged on the second pixel electrode 212, as well as on the second photosensitive resin layer 420 or on the first mask M1. The materials of the second intermediate layer 222 and the second opposite electrode 232 are described above with reference to FIG. 3.

Since a material of the second opposite electrode 232 may be deposited along a direction perpendicular to or inclined toward the substrate 100, the second opposite electrode 232 may be formed to cover the whole second intermediate layer 222 and contact the auxiliary electrode 130 in an opening of the second protective layer 410.

Referring to FIG. 14B, the second conductive protective layer 242 and the second electrode layer 172 may be formed. The first mask M1' is removed from the substrate 100 and a second mask M2' is arranged on the substrate 100. The second mask M2' includes an opening M2'-OP corresponding to the display area DA that is greater than an opening of the first mask M1'. The second mask M2' may expose a portion of the peripheral area PA such that the second power voltage supply line 150 is exposed. Accordingly, an area corresponding to an edge of the auxiliary electrode 130 and the second power voltage supply line 150 may be exposed to outside.

Then, a material having excellent characteristics with regard to an electrical conductivity and a WVTR, for example, transparent conductive oxide is deposited in correspondence with a whole area of the substrate 100 to thereby form the second conductive protective layer 242 and the second electrode layer 172. The second conductive protective layer 242 and the second electrode layer 172 may be, for example, formed by using a sputtering method, etc.

The second conductive protective layer 242 may be formed to cover the whole second opposite electrode 232. Since a material of the second conductive protective layer 242 may be deposited along a direction perpendicular to or inclined toward the substrate 100, the second conductive protective layer 242 may be formed to cover the whole second opposite electrode 232 and contact the auxiliary electrode 130 in an opening of the second protective layer 410. The second electrode layer 172 may be arranged on the first electrode layer 171. The second electrode layer 172 and the first electrode layer 171 may electrically connect the auxiliary electrode 130 to the second power voltage supply line 150 that are spaced apart from each other.

Referring to FIG. 14C, the second insulating protective layer 252 may be formed.

The second mask M2' is removed from the substrate 100 and a third mask M3' is arranged on the substrate 100. The third mask M3' includes an opening M3'-OP smaller than that of the second mask M2' and may cover the peripheral area PA. Accordingly, an edge of the auxiliary electrode 130 and the second power voltage supply line 150 may be covered by the third mask M3'.

Then, the second insulating protective layer 252 may be formed by depositing an inorganic insulating material in correspondence with a whole area of the substrate 100. The second insulating protective layer 252 may include silicon nitride, silicon oxynitride, silicon oxide, etc. The second insulating protective layer 252 may be formed by using a chemical vapor deposition method, etc. Since a material of the second insulating protective layer 252 may be deposited along a direction perpendicular to or inclined toward the substrate 100, the second insulating protective layer 252 may be formed to cover the whole second conductive layer 242 and contact the auxiliary electrode 130 in an opening of the second protective layer 410.

Then, the second protective layer 410 is removed through a lift-off process. As described above with reference to FIG. 13C, the second protective layer 410 may be removed by using a solution containing hydrofluoroether. As the second protective layer 410 is removed, the second photosensitive resin layer 420 on the second protective layer 410 and a material deposited on the second photosensitive resin layer 420 are removed together. Accordingly, the second intermediate layer 222, the second opposite electrode 232, the second conductive protective layer 242, and the second insulating protective layer 252 remain on the second pixel electrode 212. The second electrode layer 172 on the first electrode layer 171 remain in the peripheral area PA wherein the second electrode layer 172 may connect the auxiliary electrode 130 to the second power voltage supply line 150.

Figure 15A:
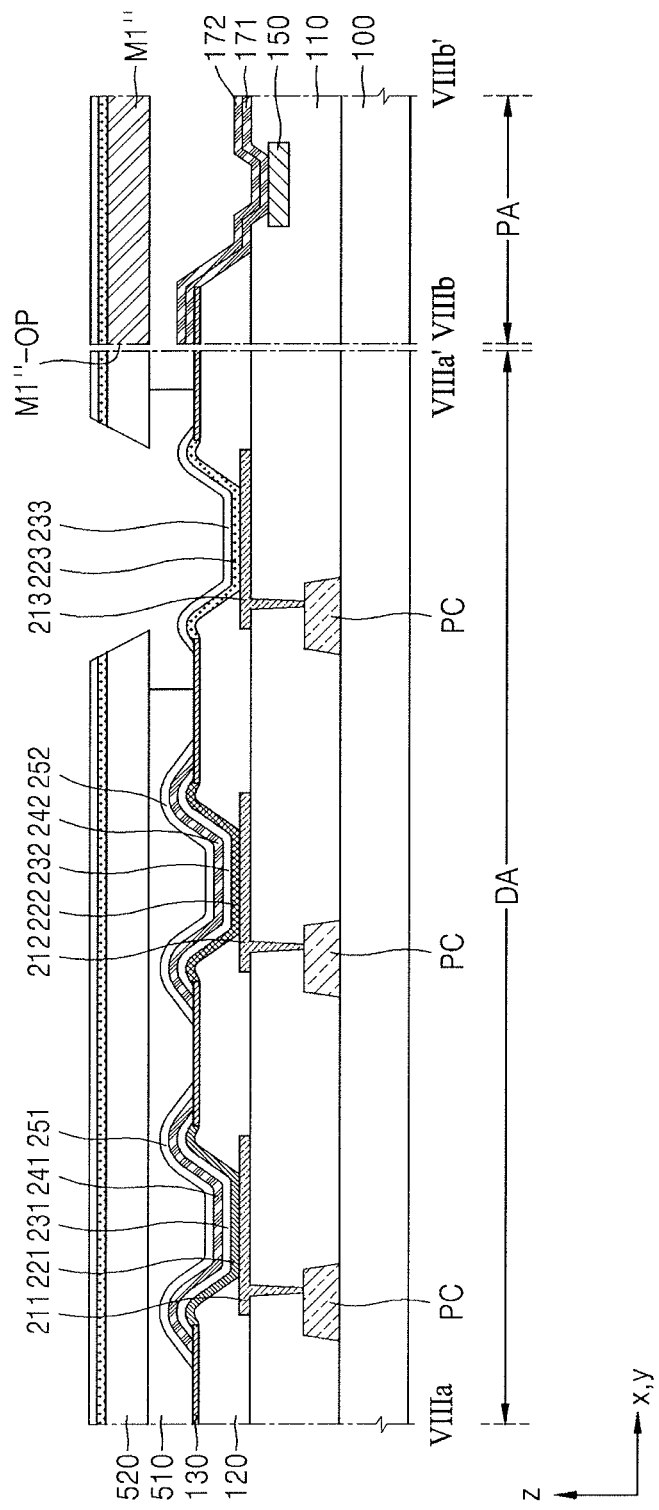
FIGS. 15A to 15C illustrate a patterning process in an area corresponding to a third pixel according to another embodiment.
Figure 15B:
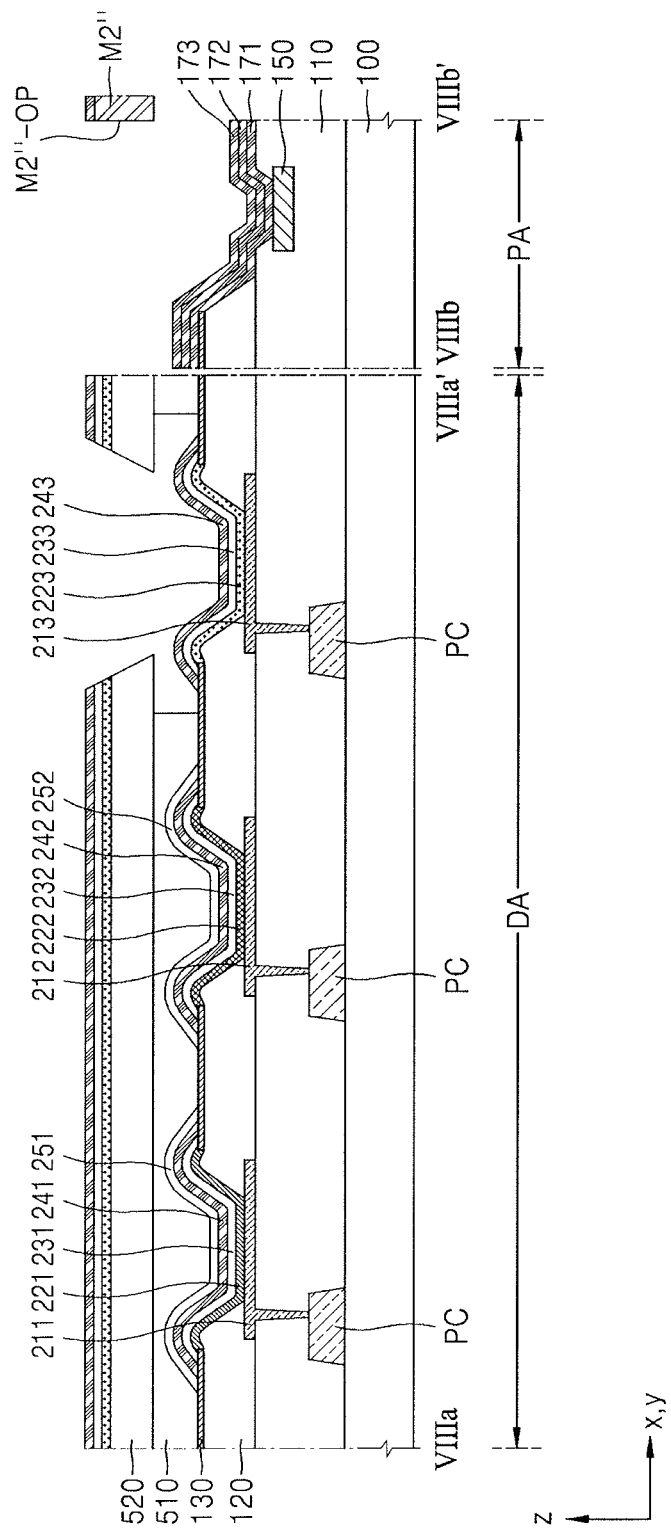
Figure 15C:
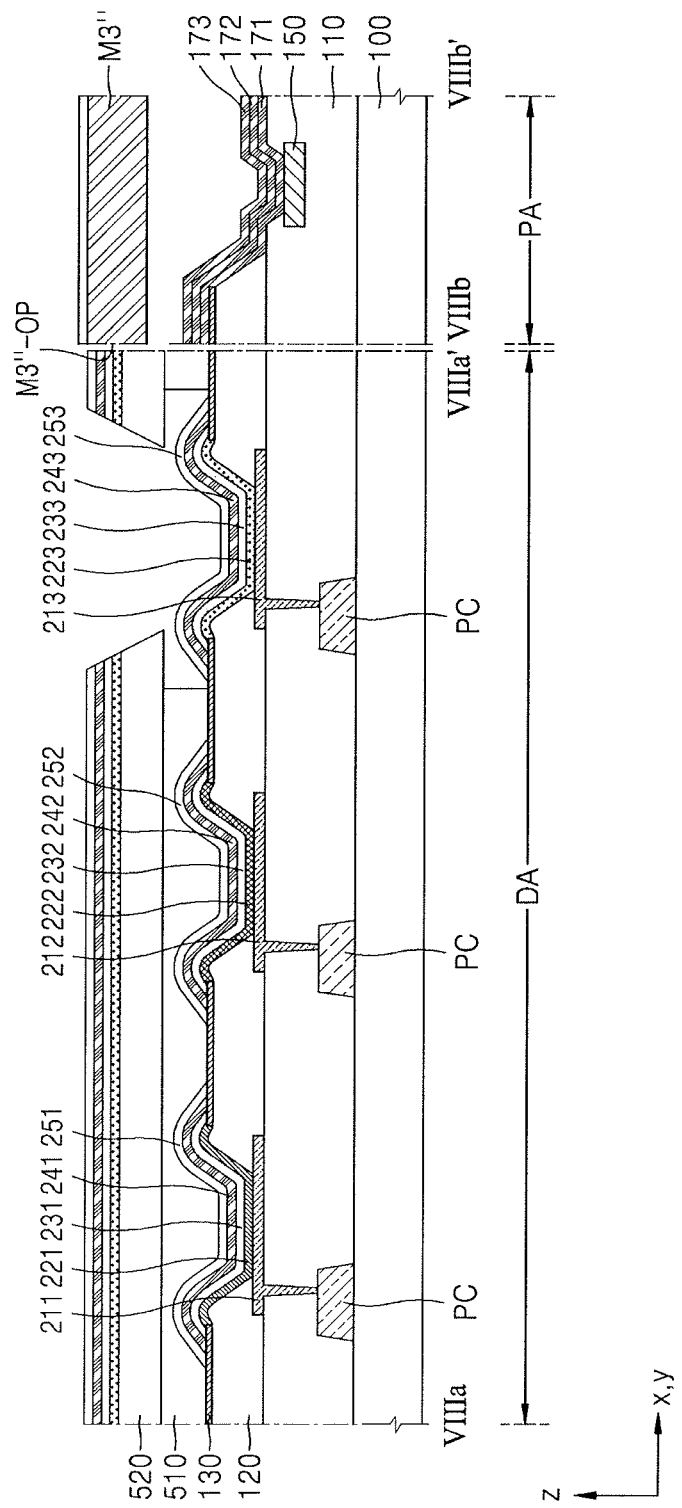

FIGS. 15A to 15C illustrate a patterning process in an area corresponding to a third pixel.

Referring to FIG. 15A, a third protective layer 510 including an opening corresponding to the third pixel electrode 213 is formed, and a third photosensitive resin layer 520 is formed on the third protective layer 510. The first mask M1" may cover the peripheral area PA and have an opening M1"-OP corresponding to the display area DA. The third protective layer 510 is formed of a non-photosensitive material, for example, fluorinated resin. A detailed description thereof is provided above with reference to the first protective layer 310.

Then, the third intermediate layer 223 and the third opposite electrode 233 are formed on the substrate 100 on which the third protective layer 510 and the third photosensitive resin layer 520 are arranged. Materials of the third intermediate layer 223 and the third opposite electrode 233 may be each formed on the third pixel electrode 213, as well as on the third photosensitive resin layer 520 and the first mask M1". The materials of the third intermediate layer 223 and the third opposite electrode 233 are described above with reference to FIG. 3.

Since a material of the third opposite electrode 233 may be deposited along a direction perpendicular to or inclined toward the substrate 100, the third opposite electrode 233 may be formed to cover the whole third intermediate layer 223 and contact the auxiliary electrode 130 in an opening of the third protective layer 510.

Referring to FIG. 15B, the third conductive protective layer 243 and the third electrode layer 173 may be formed. The first mask M1" is removed from the substrate 100 and the second mask M2" is arranged on the substrate 100. The second mask M2" may include an opening M2"-OP corresponding to the third pixel electrode 213 greater than that of the first mask M1" and may expose a region corresponding to the second power voltage supply line 150. For example, a region corresponding to an edge of the auxiliary electrode 130 and the second power voltage supply line 150 may be exposed.

Then, a material having excellent characteristics with regard to an electrical conductivity and a WVTR, for example, transparent conductive oxide is deposited in correspondence with a whole area of the substrate 100 to thereby form the third conductive protective layer 243 and the third electrode layer 173. The third conductive protective layer 243 and the third electrode layer 173 may be, for example, formed by using a sputtering method, etc.

The third conductive protective layer 243 may be formed to cover the whole third opposite electrode 233. Since a material of the third conductive protective layer 243 may be deposited along a direction perpendicular to or inclined toward the substrate 100, the third conductive protective layer 243 may be formed to cover the whole third opposite electrode 233 and contact the auxiliary electrode 130 in an opening of the third protective layer 510. The third electrode layer 173 may be arranged on the second electrode layer 172. The third electrode layer 173, the first electrode layer 171, and the second electrode layer 172 may electrically connect the auxiliary electrode 130 to the second power voltage supply line 150.

Referring to FIG. 15C, the third insulating protective layer 253 may be formed. The second mask M2" is removed from the substrate 100 and a third mask M3" is arranged on the substrate 100. The third mask M3" includes an opening M3"-OP corresponding to the display area DA. The opening M3"-OP may be smaller than that of the second mask M2" and may cover the peripheral area PA. Accordingly, an edge of the auxiliary electrode 130 and the second power voltage supply line 150 may be covered by the third mask M3".

Then, the third insulating protective layer 253 may be formed by depositing an inorganic insulating material such as silicon nitride in correspondence with the whole substrate 100. The third insulating protective layer 253 may be formed by using a chemical vapor deposition method, etc.

Since a material of the third insulating protective layer 253 may be deposited along a direction perpendicular to or inclined toward the substrate 100, the third insulating protective layer 253 may be formed to cover the whole third conductive layer 243 and contact the auxiliary electrode 130 in an opening of the third protective layer 510.

Then, as the third protective layer 510 is removed through a lift-off process, the third intermediate layer 223, the third opposite electrode 233, the third conductive protective layer 243, and the third insulating protective layer 253 remain on the third pixel electrode 213. The third electrode layer 173 on the first and second electrode layers 171 and 172 remain in the peripheral area PA wherein the third electrode layer 173 may connect the auxiliary electrode 130 to the second power voltage supply line 150.

Figure 15D:
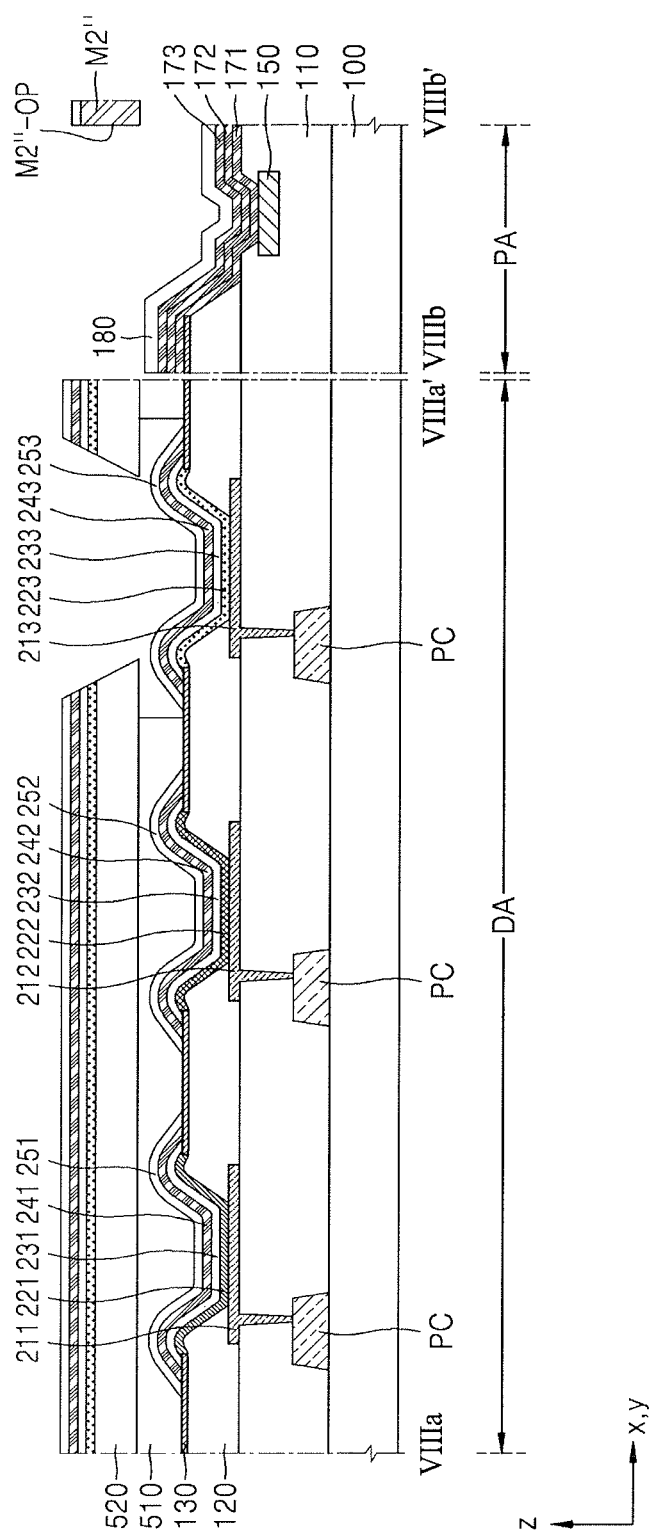
FIG. 15D illustrates a modified embodiment of a patterning process of FIG. 15C.

FIG. 15D illustrates a modified embodiment of a patterning process of FIG. 15C.

Referring to FIG. 15D, after the process described with reference to FIG. 15B is performed, when the second mask M2" remains as it is, an inorganic insulating material may be deposited in correspondence with a whole area of the substrate 100. In this case, the third insulating protective layer 253 may be formed on the third conductive protective layer 243, and the insulating layer 180 may be formed on the third electrode layer 173. That is, a display device formed according to the processes described with reference to FIGS. 12 to 15B and 15D may correspond to the structure described above with reference to FIG. 11.

By omitting some processes among the processes described above with reference to FIGS. 12 to 15D, the display device described above with reference to FIGS. 3 to 6 and 8 to 10 may be manufactured. For example, by omitting at least one of the processes described with reference to FIGS. 13B and 13C, at least one of the processes described with reference to FIGS. 14B and 14C, or at least one of the processes described with reference to FIGS. 15B and 15C or depending on which one is selected from the first to third masks M1 to M3 covering the peripheral area PA, the display devices described above with reference to FIGS. 8 to 10 or the display devices corresponding to the modified embodiments of the display devices of FIGS. 8 to 10 may be manufactured.

According to embodiments, deterioration of an organic light-emitting diode due to introduction of impurities via a pixel-defining layer may be prevented. In addition, according to embodiments, opposite electrodes may be protected during or after a process and a common power voltage may be stably applied to the opposite electrodes, wherein the opposite electrodes are patterned for each pixel by using structures of a protective layer (or protective layers), an auxiliary electrode, a connection electrode layer, etc.

When the deposition process is performed with a substrate adhered to a mask, there may be a problem whereby the mask damages a pixel-defining layer. The present embodiments are provided to solve several problems including the above-described problem. One or more embodiments include a display device including opposite electrodes patterned in each pixel, and a structure for providing a common power voltage to opposite electrodes in the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate including a display area and a peripheral area outside the display area;
pixel electrodes in the display area and spaced apart from each other;
a pixel-defining layer exposing a portion of each of upper surfaces of the pixel electrodes, covering edges of the pixel electrodes, and including an inorganic insulating material;
an auxiliary electrode on the pixel-defining layer;
a first intermediate layer on a first pixel electrode from among the pixel electrodes;
a first opposite electrode on the first intermediate layer;
a second intermediate layer on a second pixel electrode from among the pixel electrodes, the second pixel electrode neighboring the first pixel electrode;
a second opposite electrode on the second intermediate layer and electrically connected to the first opposite electrode via the auxiliary electrode;
a power voltage supply line in the peripheral area; and
a connection electrode layer electrically connecting the auxiliary electrode to the power voltage supply line.

2. The display device as claimed in claim 1, wherein the power voltage supply line is spaced apart from the auxiliary electrode and surrounds a portion of the auxiliary electrode in a plan view.

3. The display device as claimed in claim 1, wherein the connection electrode layer is on the auxiliary electrode and the power voltage supply line.

4. The display device as claimed in claim 1, wherein the auxiliary electrode is in direct contact with an upper surface of the pixel-defining layer.

5. The display device as claimed in claim 1, further comprising a conductive protective layer covering at least one of the first opposite electrode or the second opposite electrode.

6. The display device as claimed in claim 5, wherein a width of the conductive protective layer is greater than a width of the at least one of the first opposite electrode or the second opposite electrode, and the conductive protective layer is in direct contact with the at least one of the first opposite electrode or the second opposite electrode and the auxiliary electrode.

7. The display device as claimed in claim 5, wherein a material of the connection electrode layer is the same as a material of the conductive protective layer.

8. The display device as claimed in claim 5, wherein the conductive protective layer includes a transparent conductive oxide.

9. The display device as claimed in claim 1, further comprising an insulating protective layer covering at least one of the first opposite electrode or the second opposite electrode.

10. The display device as claimed in claim 9, wherein the insulating protective layer includes an inorganic insulating material.

11. The display device as claimed in claim 9, further comprising an insulating layer covering the connection electrode layer, wherein the insulating layer includes a material which is the same as a material of the insulating protective layer.

12. A display device, comprising:
pixel electrodes arranged in the display area and spaced apart from each other;
a pixel-defining layer exposing a portion of each of upper surfaces of the pixel electrodes, covering edges of the pixel electrodes, and including an inorganic insulating material;
an auxiliary electrode on the pixel-defining layer;
a first intermediate layer and a first opposite electrode, both located on a first pixel electrode from among the pixel electrodes;
a first conductive protective layer on the first opposite electrode;
a second intermediate layer and a second opposite electrode, both located on a second pixel electrode from among the pixel electrodes; and
a second conductive protective layer on the second opposite electrode.

13. The display device as claimed in claim 12, wherein the auxiliary electrode is covering the display area and includes holes corresponding to the pixel electrodes.

14. The display device as claimed in claim 12, wherein the auxiliary electrode is located only on the pixel-defining layer.

15. The display device as claimed in claim 12, wherein an end of each of the first conductive protective layer and the second conductive protective layer is in contact with the auxiliary electrode.

16. The display device as claimed in claim 12, wherein at least one of the first conductive protective layer or the second conductive protective layer includes a transparent conductive oxide.

17. The display device as claimed in claim 12, further comprising a first insulating protective layer and a second insulating protective layer which respectively correspond to the first conductive protective layer and the second conductive protective layer.

18. The display device as claimed in claim 17, wherein the first insulating protective layer and the second insulating protective layer include an inorganic insulating material.

19. The display device as claimed in claim 17, wherein an end of each of the first insulating protective layer and the second insulating protective layer is in contact with the auxiliary electrode.

20. The display device as claimed in claim 12, wherein the pixel-defining layer further includes a mound in a position corresponding to an end of each of the pixel electrodes.

21. The display device as claimed in claim 20, further comprising an insulating layer below the pixel-defining layer,
wherein a height from the insulating layer to an area, which does not overlap each of the pixel electrodes, of the pixel-defining layer is less than a height from the insulating layer to the mound.

22. The display device as claimed in claim 12, further comprising a power voltage supply line arranged outside the display area and electrically connected to the auxiliary electrode.

23. The display device as claimed in claim 22, wherein the power voltage supply line is spaced apart from the auxiliary electrode.

24. The display device as claimed in claim 23, further comprising a connection electrode layer electrically connecting the auxiliary electrode to the power voltage supply line.

25. The display device as claimed in claim 24, wherein the connection electrode layer covers the power voltage supply line and an edge of the auxiliary electrode.

* * * * *